United States Patent
Fan et al.

(10) Patent No.: US 12,368,434 B2
(45) Date of Patent: Jul. 22, 2025

(54) D FLIP-FLOP HAVING MULTIPLEXER FUNCTION

(71) Applicant: SHENZHEN MICROBT ELECTRONICS TECHNOLOGY CO., LTD., Guangdong (CN)

(72) Inventors: Zhijun Fan, Guangdong (CN); Wenbo Tian, Guangdong (CN); Weixin Kong, Guangdong (CN); Zuoxing Yang, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/272,053

(22) PCT Filed: Apr. 12, 2023

(86) PCT No.: PCT/CN2023/087747
§ 371 (c)(1),
(2) Date: Jul. 12, 2023

(87) PCT Pub. No.: WO2023/207587
PCT Pub. Date: Nov. 2, 2023

(65) Prior Publication Data
US 2024/0388281 A1 Nov. 21, 2024

(30) Foreign Application Priority Data
Apr. 28, 2022 (CN) .......................... 202210456120.7

(51) Int. Cl.
*H03K 3/012* (2006.01)
*G01R 31/3185* (2006.01)
(Continued)

(52) U.S. Cl.
CPC .................. *H03K 3/356156* (2013.01); *G01R 31/318541* (2013.01); *H03K 3/012* (2013.01); *H03K 3/037* (2013.01); *H03K 3/35606* (2013.01)

(58) Field of Classification Search
CPC ............. H03K 3/012; H03K 3/356052; H03K 3/35606; H03K 3/356147; H03K 3/356156; G01R 31/318541
See application file for complete search history.

(56) References Cited

U.S. PATENT DOCUMENTS 6,501,315 B1 12/2002 Nguyen
7,315,191 B2 * 1/2008 Branch .............. H03K 3/35625
327/199
(Continued)

FOREIGN PATENT DOCUMENTS

CN 202196566 U 4/2012
CN 104079290 A 10/2014
(Continued)

OTHER PUBLICATIONS

First Office Action for corresponding TW Application No. 112113606 (28 pages including English Translation).
(Continued)

*Primary Examiner* — Patrick O Neill
(74) *Attorney, Agent, or Firm* — Merchant & Gould P.C.

(57) ABSTRACT

The present disclosure relates to a D flip-flop having a multiplexer function, including: a first transmission gate whose data input end is configured to receive a first data signal and whose clock input end is configured to receive a first clock signal; a second transmission gate whose data input end is configured to receive a second data signal and whose clock input end is configured to receive a second clock signal; an inverted latch unit whose data input end is connected to an output end of the first transmission gate and (Continued)

an output end of the second transmission gate and whose clock input end is configured to receive a third clock signal; and an inverter whose input end is connected to an output end of the inverted latch unit and whose output end provides an output of the D flip-flop.

12 Claims, 24 Drawing Sheets

(51) Int. Cl.
*H03K 3/037* (2006.01)
*H03K 3/356* (2006.01)

(56) References Cited

U.S. PATENT DOCUMENTS

| | | | | |
|---|---|---|---|---|
| 7,375,567 | B2* | 5/2008 | Branch | H03K 3/35625 327/218 |
| 7,590,900 | B2* | 9/2009 | Kim | G01R 31/318541 714/724 |
| 7,596,732 | B2* | 9/2009 | Branch | G01R 31/318544 327/202 |
| 8,692,592 | B2* | 4/2014 | Branch | G11C 29/48 327/115 |
| 9,641,159 | B1 | 5/2017 | Liao et al. | |
| 2011/0018595 | A1 | 1/2011 | Sarthi | |
| 2012/0223739 | A1 | 9/2012 | Jung et al. | |

FOREIGN PATENT DOCUMENTS

| | | |
|---|---|---|
| CN | 102761325 B | 11/2014 |
| CN | 105471409 A | 4/2016 |
| CN | 106685411 A | 5/2017 |
| CN | 212726968 U | 3/2021 |
| CN | 112929012 A | 6/2021 |
| CN | 114567300 A | 5/2022 |
| JP | H043615 A | 1/1992 |
| JP | H04369920 A | 12/1992 |
| JP | 2005323295 A | 11/2005 |
| JP | 2009244009 A | 10/2009 |
| KR | 10-2012-0100385 | 9/2012 |

OTHER PUBLICATIONS

International Search Report and Written Opinion for PCT/CN2023/087747 mailed on Jun. 21, 2023 (18 pages including English Translation).
First Chinese Office Action dated Jun. 9, 2022 for Application No. 202210456120.7 (22 pages including English Translation).
Second Chinese Office Action dated Jjul. 7, 2022 for Application No. 202210456120.7 (17 pages including English Translation).
Notice of Grant dated Jul. 26, 2022 for Application No. 202210456120.7 (6 pages including English Translation).
First OA from Corresponding KR Appln. No. 10-2023-7026083, dated Dec. 30, 2024.
Office Action dated Apr. 21, 2025 for corresponding KR Application No. 10-2023-7026083 (15 pages including English Translation).

* cited by examiner

FIG. 1A – PRIOR ART
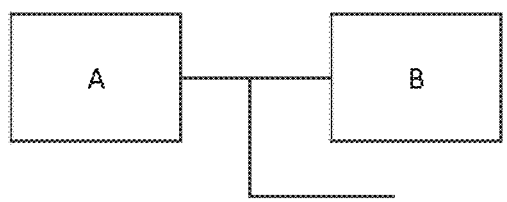
FIG. 1B – PRIOR ART
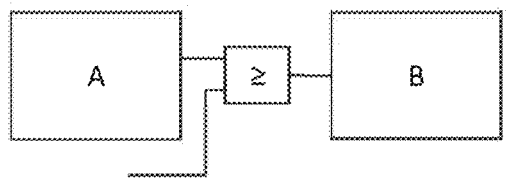
FIG. 1C – PRIOR ART
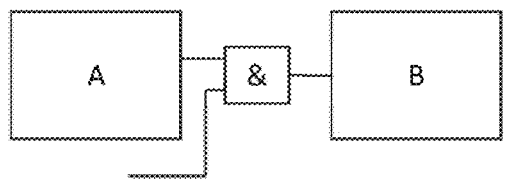
FIG. 1D – PRIOR ART

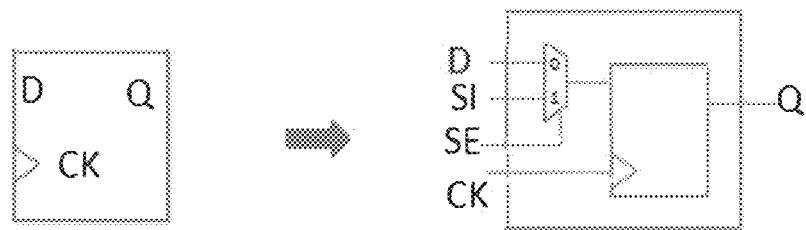
FIG. 2A – PRIOR ART
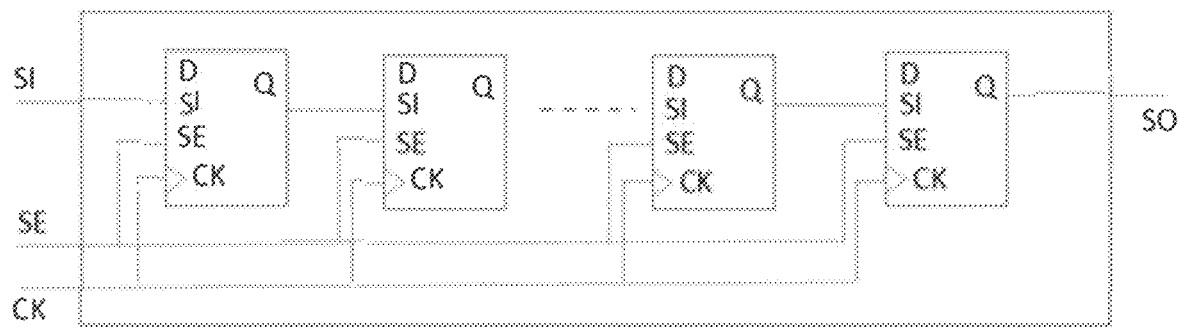
FIG. 2B – PRIOR ART
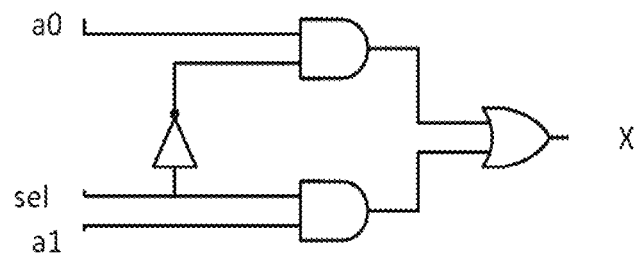
FIG. 3A – PRIOR ART
| sel | a0 | a1 | X |
|---|---|---|---|
|   | 1 | 1 | 1 |
|   | 1 | 0 | 1 |
| 0 | 0 | 1 | 0 |
|   | 0 | 0 | 0 |
|   | 1 | 1 | 1 |
|   | 1 | 0 | 0 |
| 1 | 0 | 1 | 1 |
|   | 0 | 0 | 0 |
FIG. 3B – PRIOR ART

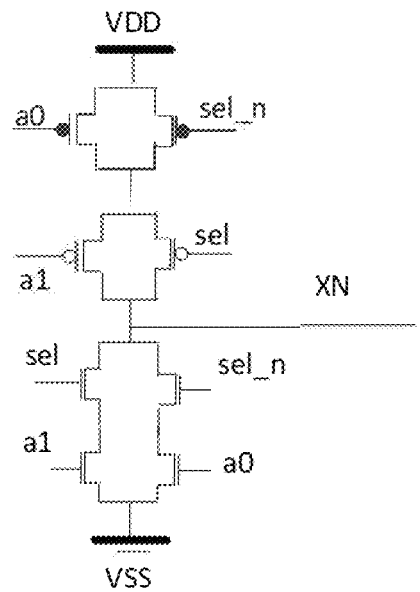
FIG. 4A – PRIOR ART
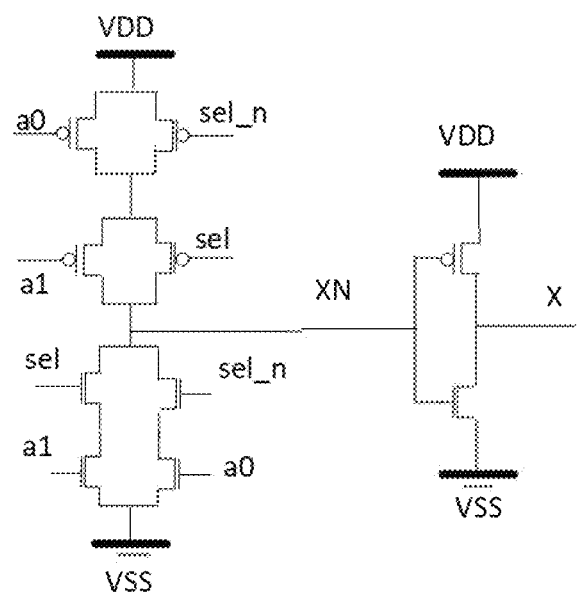
FIG. 4B – PRIOR ART

D FLIP-FLOP HAVING MULTIPLEXER FUNCTION

CROSS-REFERENCE TO RELATED APPLICATIONS

This application is a national stage of International Application No. PCT/CN2023/087747, filed on Apr. 12, 2023, which claims priority to Chinese Patent Application No. 202210456120.7, filed on Apr. 28, 2022. Both of the aforementioned applications are hereby incorporated by reference in their entireties.

TECHNICAL FIELD

The present disclosure relates to a D flip-flop having a multiplexer function.

BACKGROUND

The evaluation indicators of a chip are usually performance, power and area (PPA). The performance refers to an operating speed. The power refers to static current leakage and power consumption during operation. The area refers to the area of the chip, which represents the cost. Many application fields (for example, mining machines and artificial intelligence) are sensitive to the PPA (especially, the power). Therefore, the PPA represents the core competitiveness of a chip.

There is a matter of yield in manufacture of chips. Design for test (DFT) is a necessary technique for large-scale chips. Through the DFT, chips with errors can be screened out or chips can be graded. In the DFT, hardware logic for improving the testability (including controllability and observability) of a chip is inserted into original design of the chip, so as to enable the chip to become easy to test, thereby greatly reducing the cost of chip test.

SUMMARY

According to an aspect of the present disclosure, a D flip-flop having a multiplexer function is provided, comprising: a first transmission gate, a data input end of the first transmission gate being configured to receive a first data signal, a clock input end of the first transmission gate being configured to receive a first clock signal; a second transmission gate, a data input end of the second transmission gate being configured to receive a second data signal, a clock input end of the second transmission gate being configured to receive a second clock signal; an inverted latch unit, a data input end of the inverted latch unit being connected to an output end of the first transmission gate and an output end of the second transmission gate, a clock input end of the inverted latch unit being configured to receive a third clock signal; and an inverter, an input end of the inverter being connected to an output end of the inverted latch unit, an output end of the inverter providing an output of the D flip-flop, wherein the first clock signal and the second clock signal cause the first transmission gate and the second transmission gate to be turned on at different times, the third clock signal causes the inverted latch unit to be turned off when one of the first transmission gate and the second transmission gate is turned on and to be turned on when both the first transmission gate and the second transmission gate are turned off.

According to yet another aspect of the present disclosure, an arithmetic circuit is provided, comprising a plurality of D flip-flops of the present disclosure.

According to yet another aspect of the present disclosure, a computing apparatus is provided, comprising: a memory; and a processor comprising an arithmetic circuit of the present disclosure.

BRIEF DESCRIPTION OF THE DRAWINGS

A better understanding of the present disclosure can be obtained when the following detailed descriptions of embodiments are considered in combination with the drawings. The same or similar reference numerals are used in the drawings to denote the same or similar components. The drawings, together with the detailed description below, are incorporated in and form a part of the specification, and serve to illustrate the embodiments of the present disclosure and to explain the principles and advantages of the present disclosure.

FIG. 1A-FIG. 1D illustrate block diagrams of testing an original circuit by inserting an additional hardware circuit between logic blocks of the original circuit.

FIG. 2A illustrates a schematic diagram of replacing a common D flip-flop with a scan D flip-flop (DFF) in a scan replacement step, and FIG. 2B illustrates a schematic diagram of connecting scan DFFs together to form a scan chain in a scan splicing step.

FIG. 3A and FIG. 3B respectively illustrate a logic diagram and a truth table of a one-out-of-two multiplexer (MUX2).

FIG. 4A and FIG. 4B respectively illustrate complementary metal-oxide-semiconductor (CMOS) circuits of an inverted one-out-of-two multiplexer (MUXI2) and a one-out-of-two multiplexer (MUX2).

DETAILED DESCRIPTION

Figure 5:
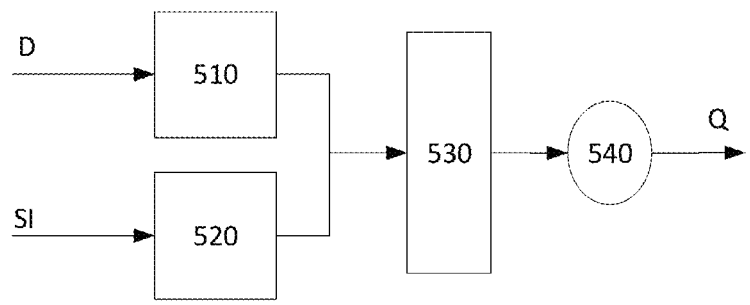
FIG. 5 illustrates a block diagram of a D flip-flop 500 having a multiplexer function according to embodiments of the present disclosure.

The following detailed description of the embodiments presents various details of the specific embodiments of the present disclosure. However, the present disclosure may be implemented in many different ways as defined and covered by the claims. In this specification, the same reference numerals may denote the same or functionally similar elements.

FIG. 1A-FIG. 1D illustrate block diagrams of testing an original circuit by inserting an additional hardware circuit between logic blocks of the original circuit. FIG. 1A illustrates the original circuit. FIG. 1B illustrates that an observation point is inserted between a logic block A and a logic block B to observe a value delivered from the logic block A to the logic block B. FIG. 1C illustrates that an OR gate is inserted between the logic block A and the logic block B to control the value delivered from the logic block A to the logic block B, namely, to force the value to be 1. FIG. 1D illustrates inserting an AND gate between the logic block A and the logic block B to control the value delivered form the logic block A to the logic block B, namely, to force the value to be 0.

In a large-scale chip, main components of a digital circuit are timing logic units and combinatorial logic units. A test process for a combinatorial logic unit is relatively simple, and usually a target error can be detected by using a single test vector. A test process for a timing logic unit is relatively complicated. In most cases, it is impossible to rely on one test vector, but a target error can be finally detected by using a sequence of test vectors.

A scan technique can transform a difficult-to-test timing circuit into an easy-to-test combinatorial circuit. The scan technique mainly includes two steps. The first step is scan replacement, in which common registers (for example, D flip-flops (DFFs)) in the circuit are replaced with scan registers (for example, scan DFFs). The second step is scan splicing, in which the scan registers in the first step are connected together to form a scan chain. FIG. 2A illustrates a schematic diagram of replacing a common DFF with a scan DFF in the scan replacement step. FIG. 2B illustrates a schematic diagram of connecting the scan DFFs together to form the scan chain in the scan splicing step.

The scan DFF includes a one-out-of-two multiplexer (MUX2) and a DFF. A logic expression of the MUX2 is X= $\overline{sel}\cdot a0+sel\cdot a1$, where sel is a selection signal, a0 is a first input, and a1 is a second input. FIG. 3A and FIG. 3B respectively illustrate a logic diagram and a truth table of a one-out-of-two multiplexer (MUX2). When the selection signal sel is logic 0, an output X is the first input a0. When the selection signal sel is logic 1, an output X is the second input a1. FIG. 4A and FIG. 4B respectively illustrate complementary metal-oxide-semiconductor (CMOS) circuits of an inverted one-out-of-two multiplexer (MUXI2) and a one-out-of-two multiplexer (MUX2). The difference between the MUXI2 and the MUX2 is that the output of the MUXI2 is an inversion of its input. However, it can be seen from FIG. 4A and FIG. 4B that the implementation of the MUXI2 is simpler, because an inverter is neglected in the MUXI2 compared with the MUX2.

However, a relatively large number of CMOS transistors are added whether the MUX2 or the MUXI2 is used in the scan DFF, which leads to an increase in the area, power and cost of the scan DFF. In addition, in the scan DFF, the MUX2 (or MUXI2) and the DFF are two separate units, which also leads to a large area occupied by the scan DFF.

In addition, in a chip, data involved in computing and storage has a bit width itself, for example, 8 bits, 16 bits, 32 bits, 64 bits, or the like. Therefore, the proportion of registers is relatively high, typically 50% of the area of the chip. If these registers are replaced with scan DFFs, it will lead to a large area, high power, and high cost of the chip.

The present disclosure provides a D flip-flop having a multiplexer function, which can serve as a scan register to replace a common register in a chip to implement a test of the chip. In the related technologies, a scan DFF is used to replace a common register in a chip to implement a test of the chip. Compared with the scan DFF, the D flip-flop of the present disclosure occupies a small area, has a small power, and has a low cost. Therefore, a chip using a D flip-flop having a multiplexer function according to embodiments of the present disclosure has the advantages of small area, small power, and low cost.

FIG. 5 illustrates a block diagram of a D flip-flop 500 having a multiplexer function according to embodiments of the present disclosure. The D flip-flop 500 includes a transmission gate 510, a transmission gate 520, an inverted latch unit 530, and an inverter 540). A data input end of the transmission gate 510 is configured to receive a first data signal D. A data input end of the transmission gate 520 is configured to receive a second data signal SI. A data input end of the inverted latch unit 530 is connected to an output end of the transmission gate 510 and an output end of the transmission gate 520. An input end of the inverter 540 is connected to an output end of the inverted latch unit 530. An output end of the inverter 540 provides an output Q of the D flip-flop 500.

In addition, a clock input end (not shown) of the transmission gate 510 is configured to receive a first clock signal. A clock input end (not shown) of the transmission gate 520 is configured to receive a second clock signal. A clock input end (not shown) of the inverted latch unit 530 is configured to receive a third clock signal. The first clock signal and the second clock signal cause the transmission gate 510 and the transmission gate 520 to be turned on at different times. Therefore, the first data signal D and the second data signal SI are transmitted to the input end of the inverted latch unit 530 at different times. In other words, by configuring clock signals applied to the transmission gate 510 and the transmission gate 520, whether the first data signal D or the second data signal SI is transmitted to the input end of the inverted latch unit 530 may be selected. The third clock signal causes the inverted latch unit 530 to be turned off when one of the transmission gate 510 and the transmission gate 520 is turned on, and the inverted latch unit 530 to be turned on when both the transmission gate 510 and the transmission gate 520 are turned off.

The data input end of the inverted latch unit 530 receives the first data signal D or the second data signal SI, and outputs an inverted first data signal or an inverted second data signal at the output end when turned on. The input end of the inverter 540 receives the inverted first data signal or the inverted second data signal, and outputs the first data signal D or the second data signal SI. Therefore, an output of the D flip-flop 500 is the first data signal D or the second data signal SI.

Therefore, the D flip-flop 500 has not only a register function but also a multiplexer function. The transmission gates and the inverted latch unit in the D flip-flop 500 are all timing logic units. It can be seen that the D flip-flop 500 implements both the register function and the multiplexer function by using the timing logic units. However, a multiplexer in an existing scan DFF is a combinatorial logic unit, and the DFF is a timing logic unit. In other words, the existing scan DFF requires separate combinatorial logic unit and timing logic unit to implement both the register function and the multiplexer function. Therefore, the D flip-flop according to the embodiments of the present disclosure has the advantages of small area, small power, and low cost compared with a conventional scan DFF.

In some embodiments of the present disclosure, one of the first data signal D and the second data signal SI is a functional data signal, and the other one of the first data signal D and the second data signal SI is a scan data signal. Therefore, when a circuit needs to be tested, a specific scan data signal may be inputted to the D flip-flop 500 under the control of clock signals for circuit test.

FIG. 6A to FIG. 6D illustrate CMOS circuits 600A to 600D that implement the D flip-flop 500 in FIG. 5 according to embodiments of the present disclosure. The transmission gate 510 is implemented by a PMOS transistor 511 and an NMOS transistor 512 connected in parallel. The transmission gate 520 is implemented by a PMOS transistor 521 and an NMOS transistor 522 connected in parallel. The inverter 540 is implemented by a PMOS transistor 541 and an NMOS transistor 542 connected in series between a power supply terminal VDD and a grounding terminal VSS. In other words, the inverter 540 is implemented as a NOT gate.

Figure 6A:
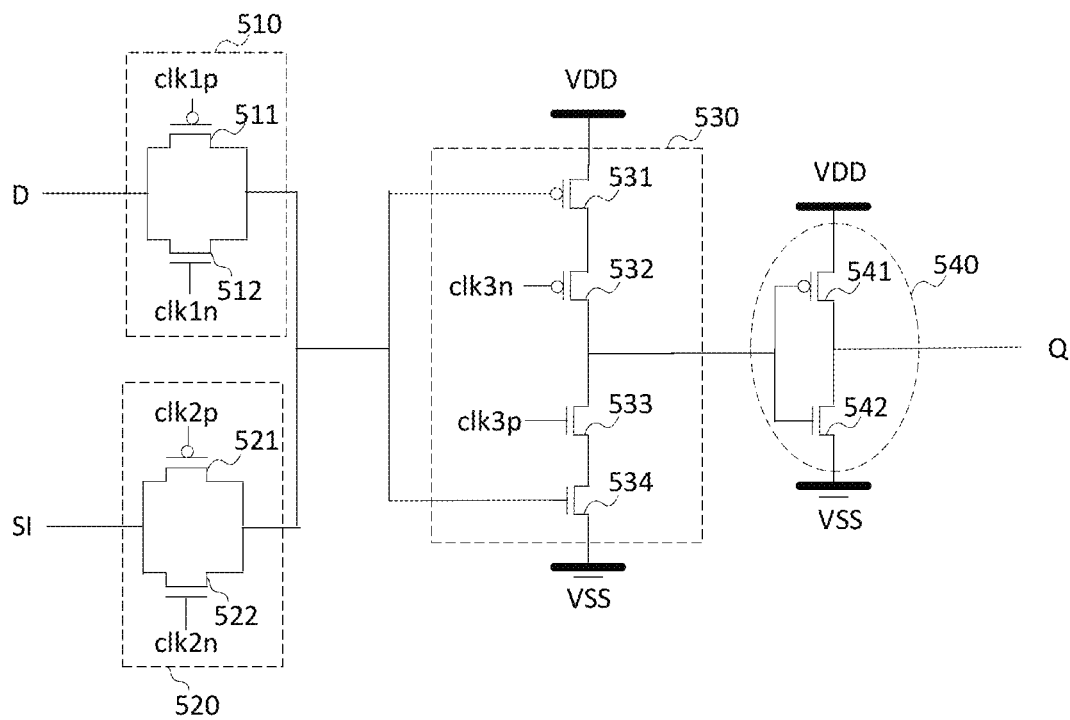
FIG. 6A to FIG. 6D illustrate CMOS circuits 600A to 600D that implement the D flip-flop 500 in FIG. 5 according to embodiments of the present disclosure.
Figure 6B:
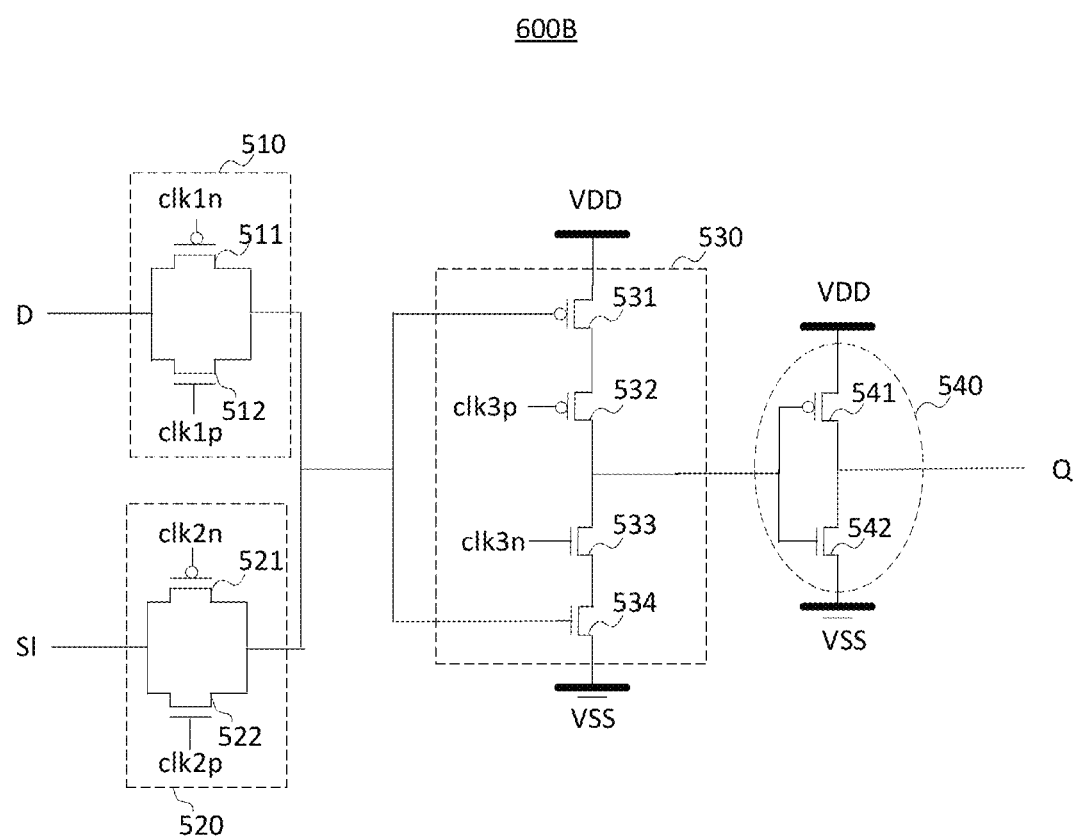
Figure 6C:
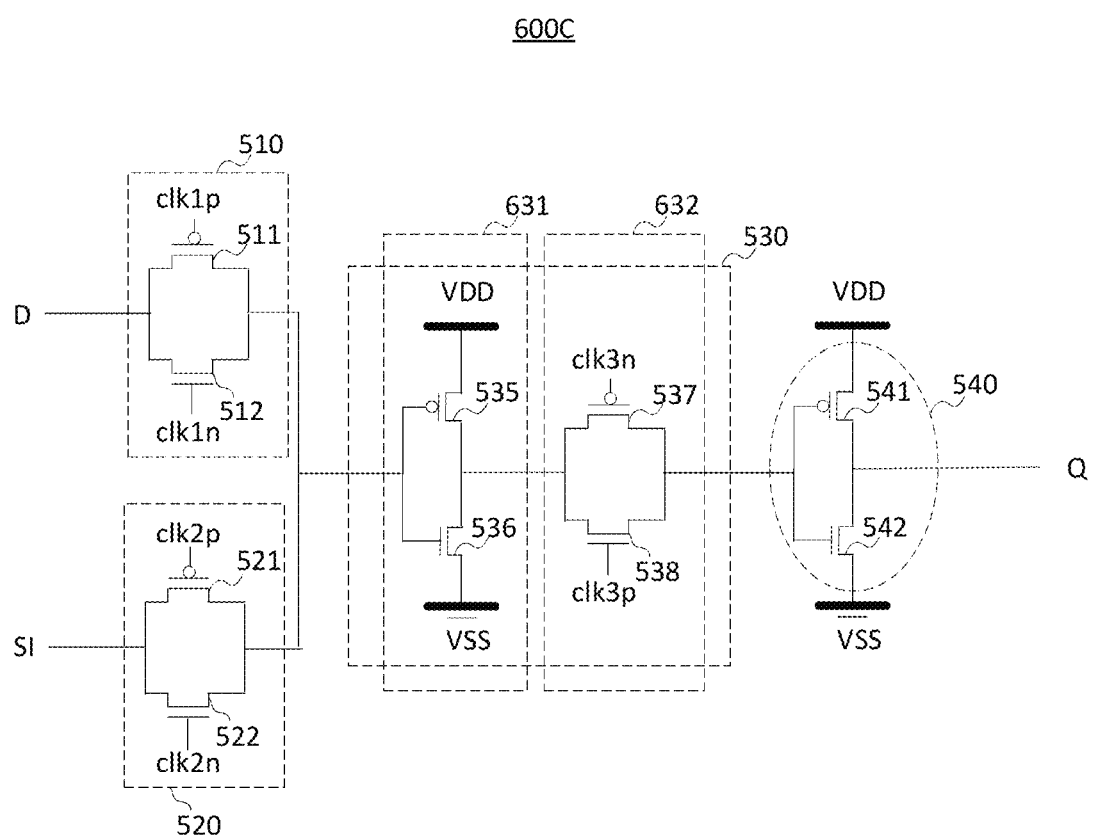
Figure 6D:
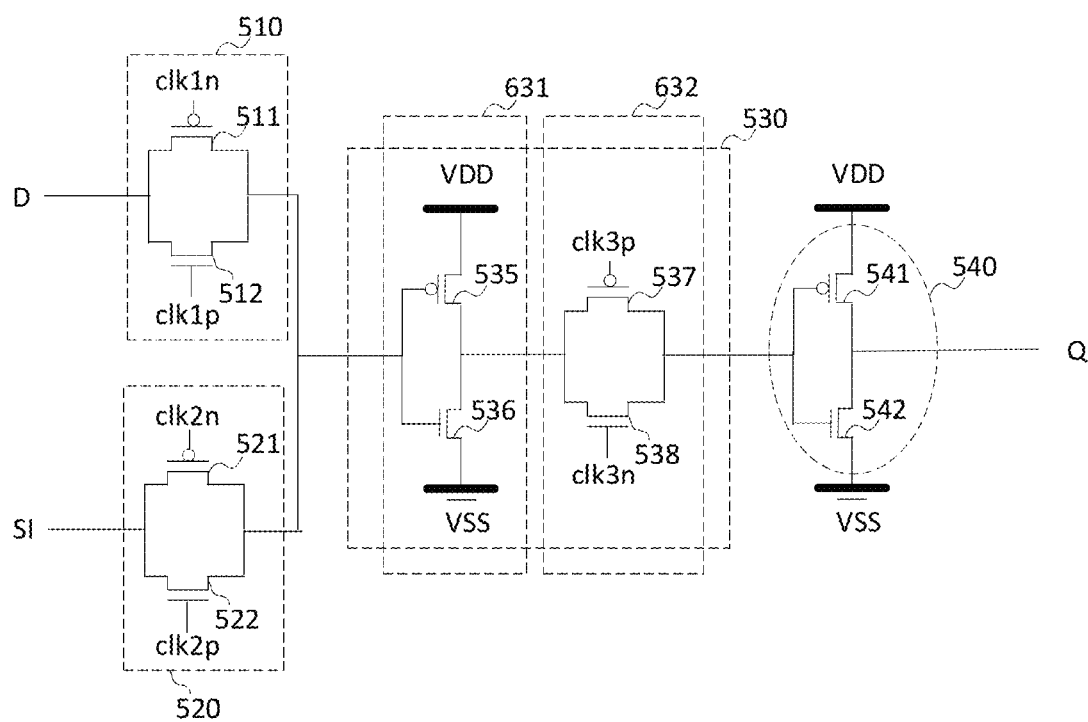

The inverted latch unit 530 in FIG. 6A and FIG. 6B is implemented by PMOS transistors 531 and 532 and NMOS transistors 533 and 534 connected in series between the power supply terminal VDD and the grounding terminal VSS. In other words, the inverted latch unit 530 in FIG. 6A and FIG. 6B is implemented as a tri-state gate. The inverted latch unit 530 in FIG. 6C and FIG. 6D is implemented by an inverter 631 and a transmission gate 632 connected in series. The inverter 631 is implemented by a PMOS transistor 535 and an NMOS transistor 536 connected in series between the power supply terminal VDD and the grounding terminal VSS. The transmission gate 632 is implemented by a PMOS transistor 537 and an NMOS transistor 538 connected in parallel.

As shown in FIG. 6A and FIG. 6B, the inverted latch unit 530 adopts the following configuration of a tri-state gate: a gate of the PMOS transistor 531 and a gate of the NMOS transistor 534 are connected together as the data input end of the inverted latch unit 530; a drain of the PMOS transistor 532 and a drain of the NMOS transistor 533 are connected together as the output end of the inverted latch unit 530; and a gate of the PMOS transistor 532 and a gate of the NMOS transistor 533 are respectively configured to receive clock signals having opposite phases.

In some embodiments of the present disclosure, the inverted latch unit 530 may adopt another configuration of a tri-state gate: a gate of the PMOS transistor 532 and a gate of the NMOS transistor 533 are connected together as the data input end of the inverted latch unit 530; a drain of the PMOS transistor 532 and a drain of the NMOS transistor 533 are connected together as the output end of the inverted latch unit 530; and a gate of the PMOS transistor 531 and a gate of the NMOS transistor 534 are respectively configured to receive clock signals having opposite phases.

In FIG. 6A, the PMOS transistor 511 is applied with an in-phase signal clk1p of the first clock signal, and the NMOS transistor 512 is applied with an inverted signal clk1n of the first clock signal. Therefore, the transmission gate 510 outputs the first data signal D when clk1p is at a low level and clk1n is at a high level. The PMOS transistor 521 is applied with an in-phase signal clk2p of the second clock signal, and the NMOS transistor 522 is applied with an inverted signal clk2n of the second clock signal. Therefore, the transmission gate 520 outputs the second data signal SI when clk2p is at a low level and clk2n is at a high level.

The in-phase signal clk1p of the first clock signal and the in-phase signal clk2p of the second clock signal are at a low level at different times, and therefore the transmission gate 510 and the transmission gate 520 are turned on at different times. Therefore, the first data signal D and the second data signal SI are transmitted to the input end of the inverted latch unit 530 at different times.

The PMOS transistor 532 is applied with an inverted signal clk3n of the third clock signal, and the NMOS transistor 533 is applied with an in-phase signal clk3p of the third clock signal. Therefore, the inverted latch unit 530 outputs the inverted first data signal or the inverted second data signal when clk3p is at a high level and clk3n is at a low level. Further, the inverter 540 outputs the first data signal or the second data signal. Therefore, the CMOS circuit in FIG. 6A implements a D flip-flop triggered by a rising edge.

In FIG. 6B, a gate of the PMOS transistor 511 and a gate of the NMOS transistor 512 are configured to receive the inverted signal clk1n and the in-phase signal clk1p, of the first clock signal, having opposite phases, respectively. Because the PMOS transistor 511 is applied with the inverted signal clk1n of the first clock signal and the NMOS transistor 512 is applied with the in-phase signal clk1p of the first clock signal, the transmission gate 510 is turned on and outputs the first data signal D when clk1p is at a high level and clk1n is at a low level.

A gate of the PMOS transistor 521 and a gate of the NMOS transistor 522 are configured to receive the inverted signal clk2n and the in-phase signal clk2p, of the second clock signal, having opposite phases, respectively. Because the PMOS transistor 521 is applied with the inverted signal clk2n of the second clock signal and the NMOS transistor 522 is applied with the in-phase signal clk2p of the second clock signal, the transmission gate 520 is turned on and outputs the second data signal SI when clk2p is at a high level and clk2n is at a low level.

The in-phase signal clk1p of the first clock signal and the in-phase signal clk2p of the second clock signal are at a high level at different times, and therefore the transmission gate 510 and the transmission gate 520 are turned on at different times. Therefore, the first data signal D and the second data signal SI are transmitted to the input end of the inverted latch unit 530 at different times.

The PMOS transistor 532 is applied with the in-phase signal clk3p of the third clock signal, and the NMOS transistor 533 is applied with the inverted signal clk3n of the third clock signal. Therefore, the inverted latch unit 530 outputs the inverted first data signal or the inverted second data signal when clk3p is at a low level and clk3n is at a high level. Further, the inverter 540 outputs the first data signal or the second data signal. Therefore, the CMOS circuit in FIG. 6B implements a D flip-flop triggered by a falling edge.

In FIG. 6C, the PMOS transistor 511 is applied with an in-phase signal clk1p of the first clock signal, and the NMOS transistor 512 is applied with an inverted signal clk1n of the first clock signal. Therefore, the transmission gate 510 outputs the first data signal D when clk1p is at a low level and clk1n is at a high level. The PMOS transistor 521 is applied with an in-phase signal clk2p of the second clock signal, and the NMOS transistor 522 is applied with an inverted signal clk2n of the second clock signal. Therefore, the transmission gate 520 outputs the second data signal SI when clk2p is at a low level and clk2n is at a high level.

The in-phase signal clk1p of the first clock signal and the in-phase signal clk2p of the second clock signal are at a low level at different times, and therefore the transmission gate 510 and the transmission gate 520 are turned on at different times. Therefore, the first data signal D and the second data signal SI are transmitted to the input end of the inverted latch unit 530 at different times.

The PMOS transistor 537 is applied with an inverted signal clk3n of the third clock signal, and the NMOS transistor 538 is applied with an in-phase signal clk3p of the third clock signal. Therefore, the inverted latch unit 530 outputs the inverted first data signal or the inverted second data signal when clk3p is at a high level and clk3n is at a low level. Further, the inverter 540 outputs the first data signal or the second data signal. Therefore, the CMOS circuit in FIG. 6C implements a D flip-flop triggered by a rising edge.

In FIG. 6D, a gate of the PMOS transistor 511 and a gate of the NMOS transistor 512 are configured to receive an inverted signal clk1n and an in-phase signal clk1p, of the first clock signal, having opposite phases, respectively. Because the PMOS transistor 511 is applied with the inverted signal clk1n of the first clock signal and the NMOS transistor 512 is applied with the in-phase signal clk1p of the first clock signal, the transmission gate 510 is turned on and outputs the first data signal D when clk1p is at a high level and clk1n is at a low level.

A gate of the PMOS transistor 521 and a gate of the NMOS transistor 522 are configured to receive an inverted signal clk2n and an in-phase signal clk2p, of the second clock signal, having opposite phases, respectively. Because the PMOS transistor 521 is applied with the inverted signal clk2n of the second clock signal and the NMOS transistor 522 is applied with the in-phase signal clk2p of the second clock signal, the transmission gate 520 is turned on and outputs the second data signal SI when clk2p is at a high level and clk2n is at a low level.

The in-phase signal clk1p of the first clock signal and the in-phase signal clk2p of the second clock signal are at a high level at different times, and therefore the transmission gate 510 and the transmission gate 520 are turned on at different times. Therefore, the first data signal D and the second data signal SI are transmitted to the input end of the inverted latch unit 530 at different times.

The PMOS transistor 537 is applied with an in-phase signal clk3p of the third clock signal, and the NMOS transistor 538 is applied with an inverted signal clk3n of the third clock signal. Therefore, the inverted latch unit 530 outputs the inverted first data signal or the inverted second data signal when clk3p is at a low level and clk3n is at a high level. Further, the inverter 540 outputs the first data signal or the second data signal. Therefore, the CMOS circuit in FIG. 6D implements a D flip-flop triggered by a falling edge.

In some embodiments of the present disclosure, the in-phase signal clk1p of the first clock signal may be obtained by performing an AND operation on a common clock signal and an inverted selection signal, and the inverted signal clk1n of the first clock signal is obtained by performing a NOT operation on clk1p. The in-phase signal clk2p of the second clock signal is obtained by performing an AND operation on the common clock signal and a selection signal, and the inverted signal clk2n of the second clock signal is obtained by performing a NOT operation on clk2p. The in-phase signal clk3p of the third clock signal is the common clock signal, and the inverted signal clk3n of the third clock signal is obtained by performing a NOT operation on the common clock signal.

In some embodiments of the present disclosure, the in-phase signal clk1p of the first clock signal may be obtained by performing an AND operation on a common clock signal and a selection signal, and the inverted signal clk1n of the first clock signal is obtained by performing a NOT operation on clk1p. The in-phase signal clk2p of the second clock signal is obtained by performing an AND operation on the common clock signal and an inverted selection signal, and the inverted signal clk2n of the second clock signal is obtained by performing a NOT operation on clk2p.

The D flip-flop 500 is a dynamic D flip-flop and its output end has a current leakage problem. In order to further solve the current leakage problem, the present disclosure further provides a semi-static D flip-flop, which can effectively alleviate the current leakage problem of the output end.

Figure 7:
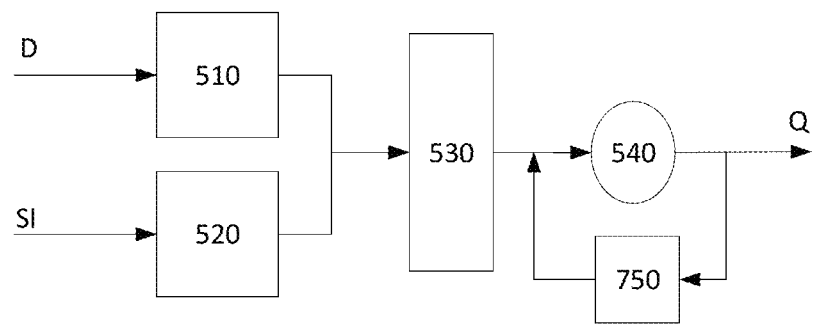
FIG. 7 illustrates a block diagram of a D flip-flop 700 having a multiplexer function according to embodiments of the present disclosure.

FIG. 7 illustrates a D flip-flop 700 having a multiplexer function according to embodiments of the present disclosure. The D flip-flop 700 includes a transmission gate 510, a transmission gate 520, an inverted latch unit 530, an inverter 540, and an inverted feedback unit 750. The configurations of the transmission gate 510, the transmission gate 520, the inverted latch unit 530, and the inverter 540 of the D flip-flop 700 have been described with reference to FIG. 5. The D flip-flop 700 differs from the D flip-flop 500 in that the inverted feedback unit 750 is added to the D flip-flop 700. A data input end of the inverted feedback unit 750 is connected to the output end of the inverter 540. An output end of the inverted feedback unit 750 is connected to the input end of the inverter 540).

A clock input end (not shown) of the inverted feedback unit 750 is configured to receive a fourth clock signal. The fourth clock signal causes the inverted feedback unit 750 to be turned off when the inverted latch unit 530 is turned on. The fourth clock signal causes the inverted feedback unit 750 to be turned on when the inverted latch unit 530 is turned off. Therefore, the inverted feedback unit 750 can invert charges at the output end of the inverter 540 and feed them back to the input end of the inverter 540. Therefore, the D flip-flop 700, which is a semi-static D flip-flop, can effectively alleviate the current leakage problem of the output end of the D flip-flop.

The inverted feedback unit 750 may be implemented by a tri-state gate, or by an inverter and a transmission gate connected in series. FIG. 8A to FIG. 8D illustrate CMOS circuits 800A to 800D that implement the D flip-flop 700 in FIG. 7 according to embodiments of the present disclosure. In FIG. 8A to FIG. 8D, the inverted feedback unit 750 is implemented by PMOS transistors 751 and 752 and NMOS transistors 753 and 754 connected in series between the power supply terminal VDD and the grounding terminal VSS. In other words, the inverted feedback unit 750 is implemented as a tri-state gate.

As shown in FIG. 8A to FIG. 8D, the inverted feedback unit 750 adopts the following configuration of a tri-state gate: a gate of the PMOS transistor 751 and a gate of the NMOS transistor 754 are connected together as the data input end of the inverted feedback unit 750; a drain of the PMOS transistor 752 and a drain of the NMOS transistor 753 are connected together as the output end of the inverted feedback unit 750; and a gate of the PMOS transistor 752 and a gate of the NMOS transistor 753 are respectively configured to receive clock signals having opposite phases.

In some embodiments of the present disclosure, the inverted feedback unit 750 may adopt another configuration of a tri-state gate: a gate of the PMOS transistor 752 and a gate of the NMOS transistor 753 are connected together as the data input end of the inverted feedback unit 750; a drain of the PMOS transistor 752 and a drain of the NMOS transistor 753 are connected together as the output end of the inverted feedback unit 750; and a gate of the PMOS transistor 751 and a gate of the NMOS transistor 754 are respectively configured to receive clock signals having opposite phases.

Figure 8A:
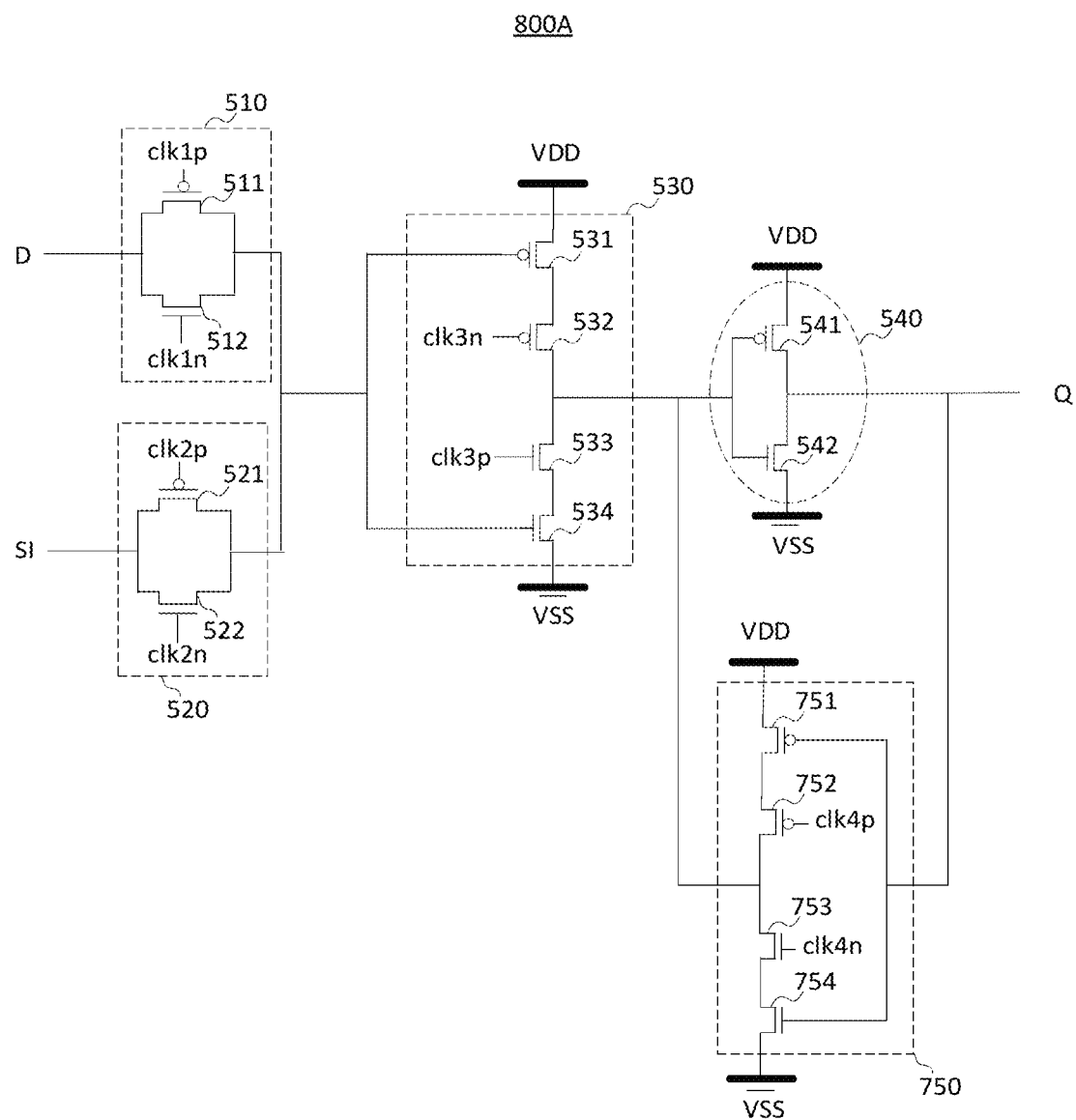
FIG. 8A to FIG. 8D illustrate CMOS circuits 800A to 800D that implement the D flip-flop 700 in FIG. 7 according to embodiments of the present disclosure.
Figure 8B:
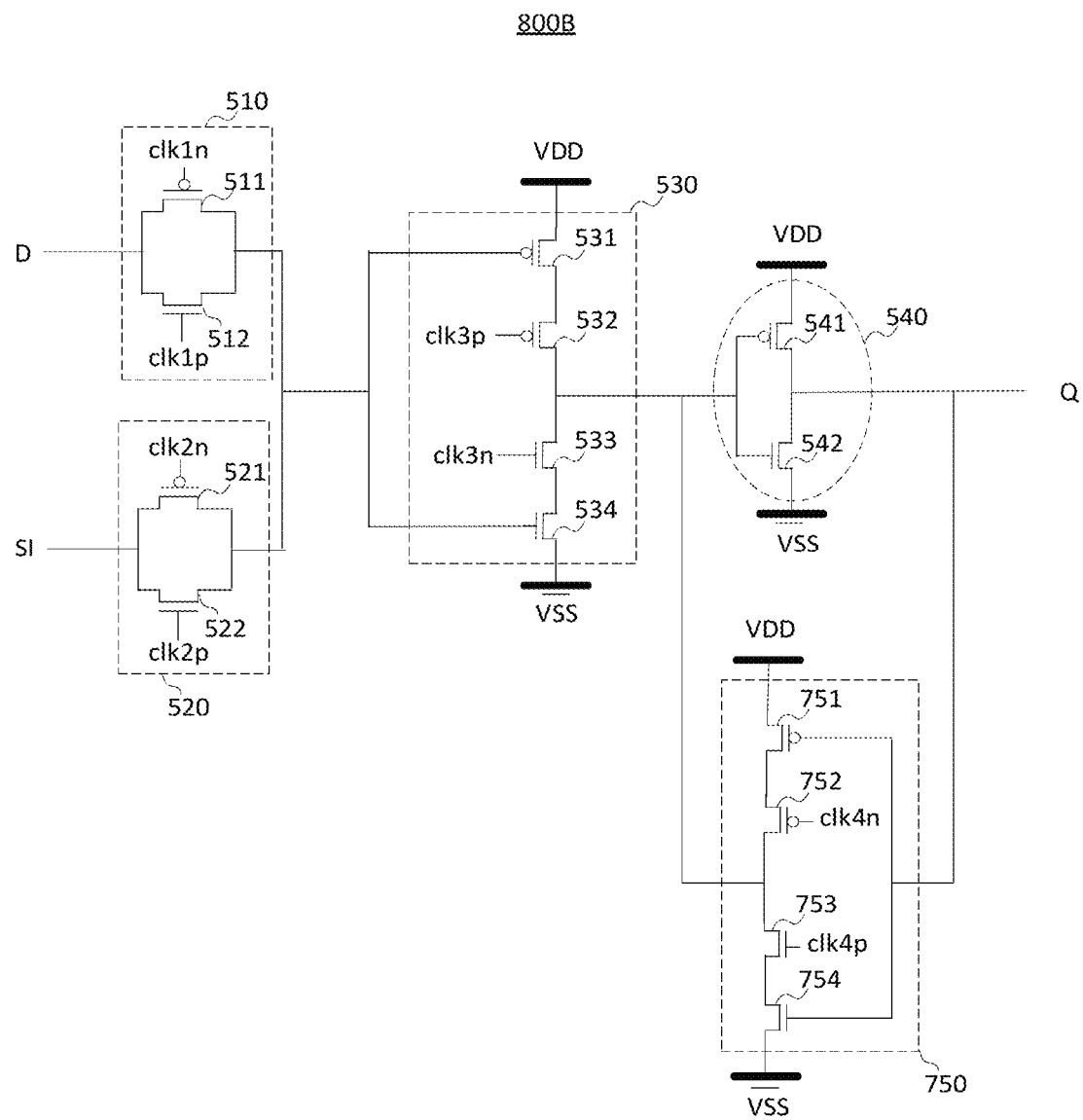
Figure 8C:
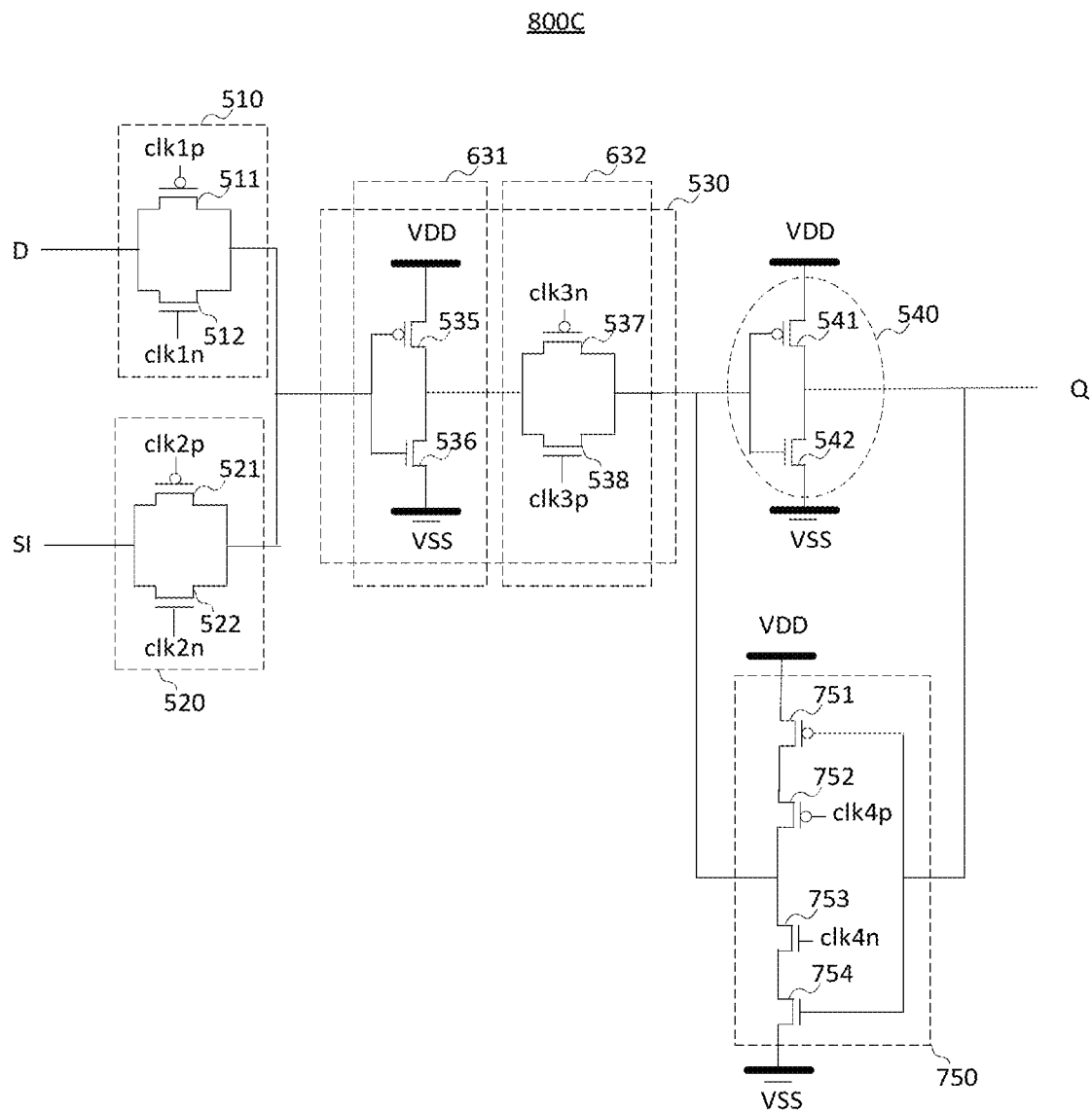

In FIG. 8A and FIG. 8C, a gate of the PMOS transistor 752 and a gate of the NMOS transistor 753 are configured to receive an in-phase signal clk4p and an inverted signal clk4n, of the fourth clock signal, having opposite phases, respectively. Therefore, the inverted feedback unit 750 is turned off when clk4p is at a high level and clk4n is at a low level, and is turned on when clk4p is at a low level and clk4n is at a high level.

Figure 8D:
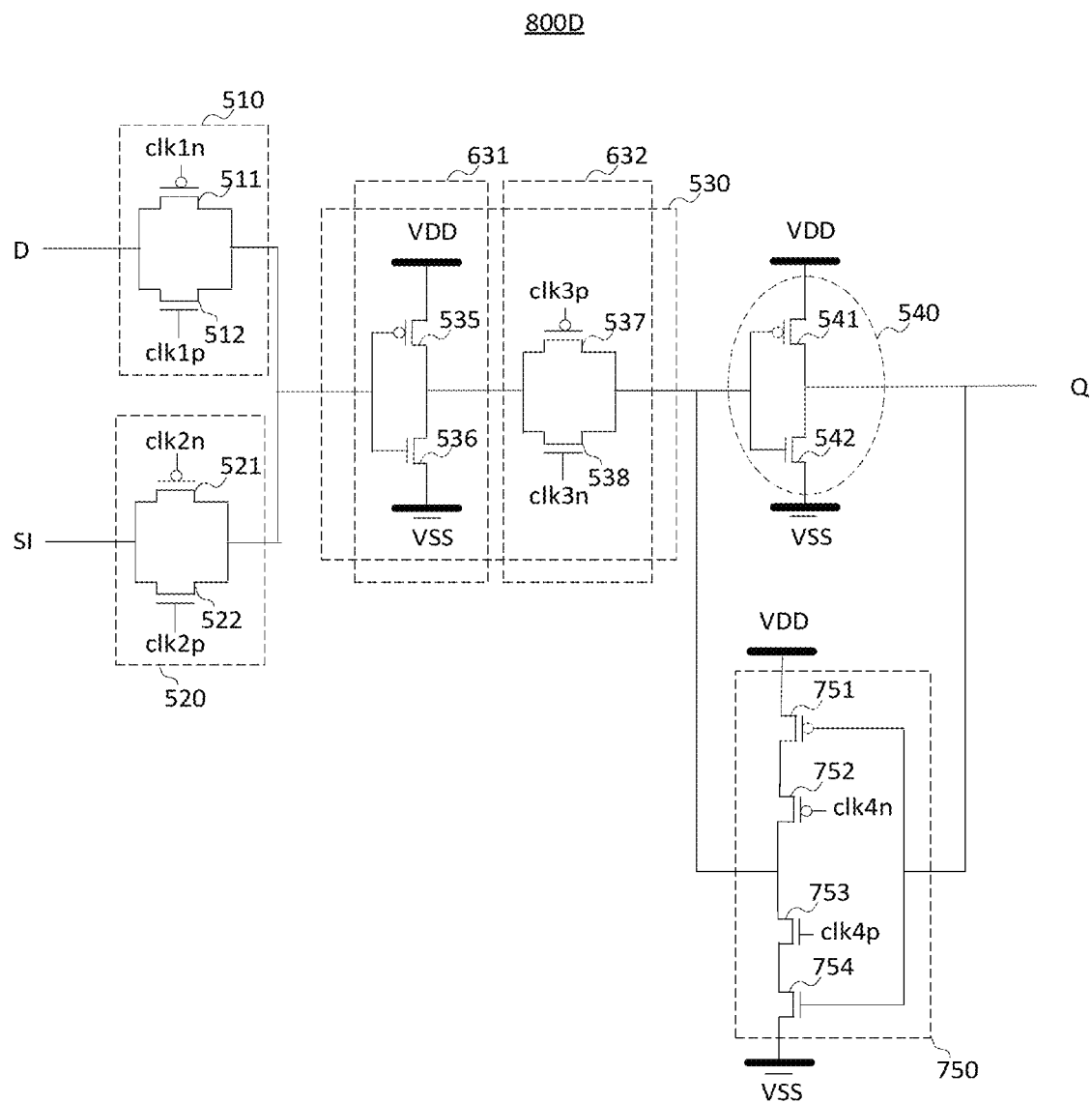

In FIG. 8B and FIG. 8D, a gate of the PMOS transistor 752 is configured to receive the inverted signal clk4n of the fourth clock signal, and a gate of the NMOS transistor 753 is configured to receive the in-phase signal clk4p of the fourth clock signal. Therefore, the inverted feedback unit 750 is turned on when clk4p is at a high level and clk4n is at a low level, and is turned off when the in-phase signal clk4p of the fourth clock signal is at a low level and clk4n is at a high level.

FIG. 9A to FIG. 9D illustrate CMOS circuits 900A to 900D that implement the D flip-flop 700 in FIG. 7 according to embodiments of the present disclosure. In FIG. 9A to FIG. 9D, the inverted feedback unit 750 is implemented by an inverter 941 and a transmission gate 942 connected in series. A PMOS transistor 755 and an NMOS transistor 756 connected in series between the power supply terminal VDD and the grounding terminal VSS form the inverter 941. A PMOS transistor 757 and an NMOS transistor 758 connected in parallel form the transmission gate 942. An input end of the inverter 941 is used as an input end of the inverted feedback unit 750. An output end of the transmission gate 942 is used as an output end of the inverted feedback unit 750.

Figure 9A:
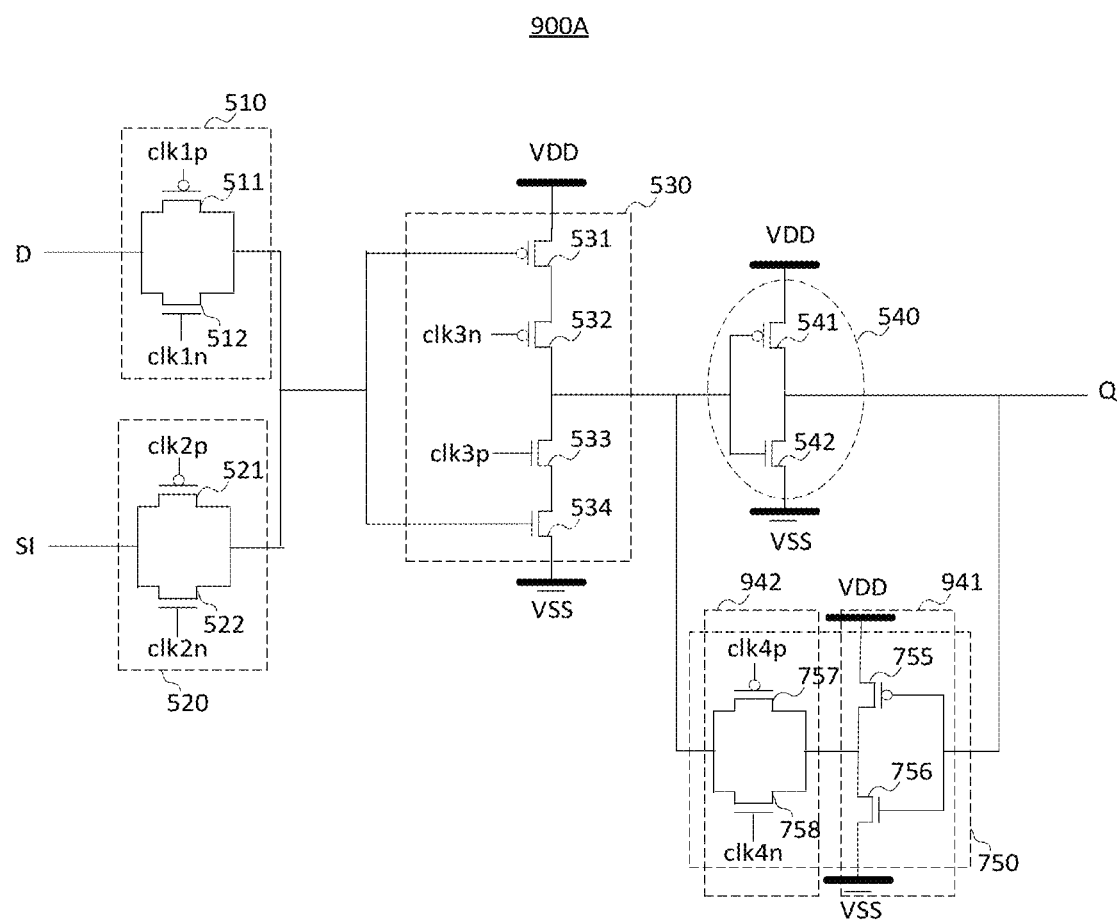
FIG. 9A to FIG. 9D illustrate CMOS circuits 900A to 900D that implement the D flip-flop 700 in FIG. 7 according to embodiments of the present disclosure.
Figure 9B:
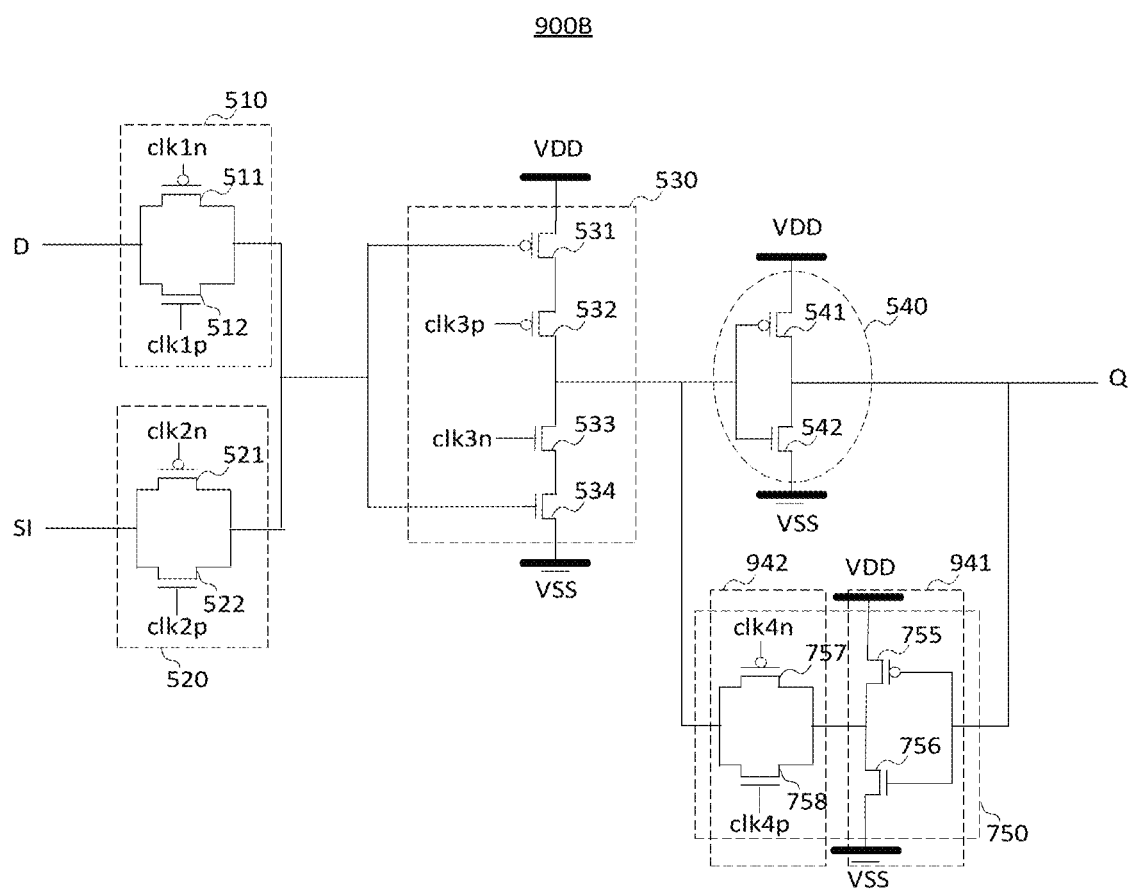
Figure 9C:
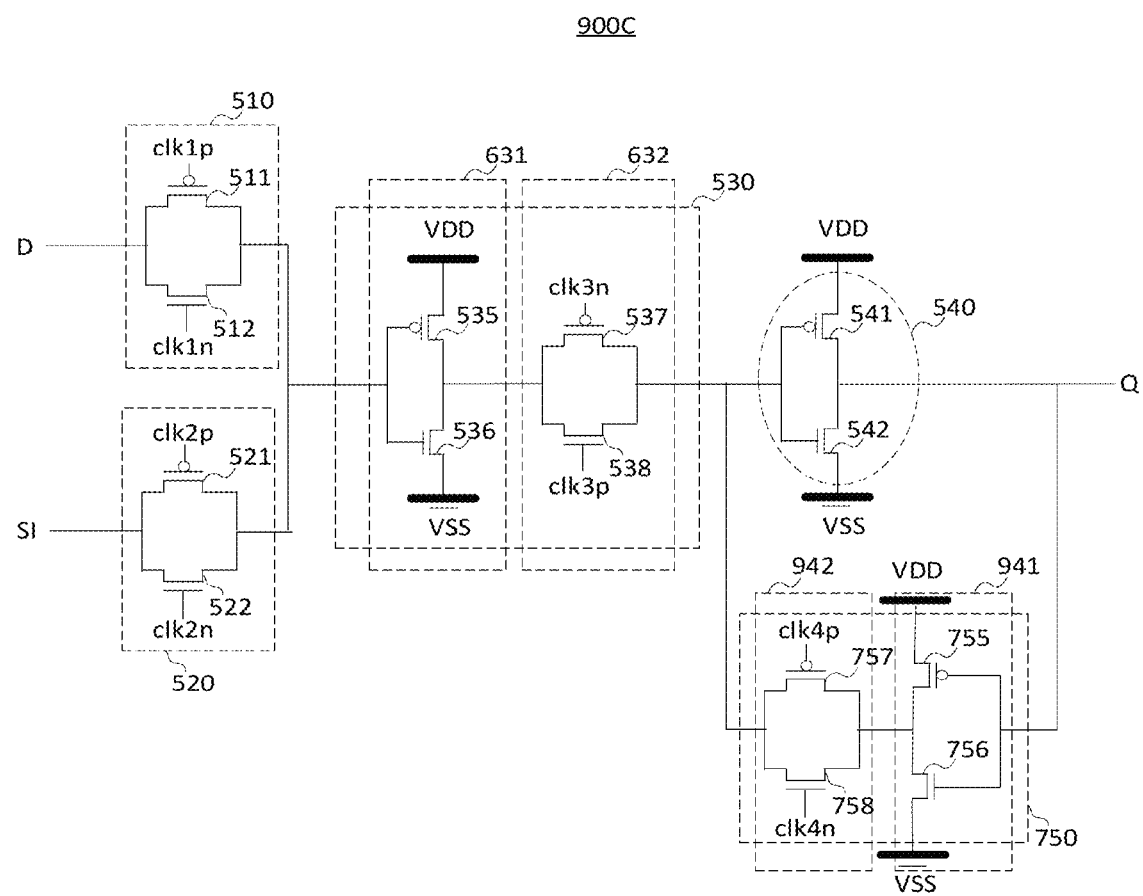

In FIG. 9A and FIG. 9C, a gate of the PMOS transistor 757 is configured to receive the in-phase signal clk4p of the fourth clock signal, and a gate of the NMOS transistor 758 is configured to receive the inverted signal clk4n of the fourth clock signal. Therefore, the inverted feedback unit 750 is turned on when clk4p is at a low level and clk4n is at a high level, and is turned off when clk4p is at a high level and clk4n is at a low level.

Figure 9D:
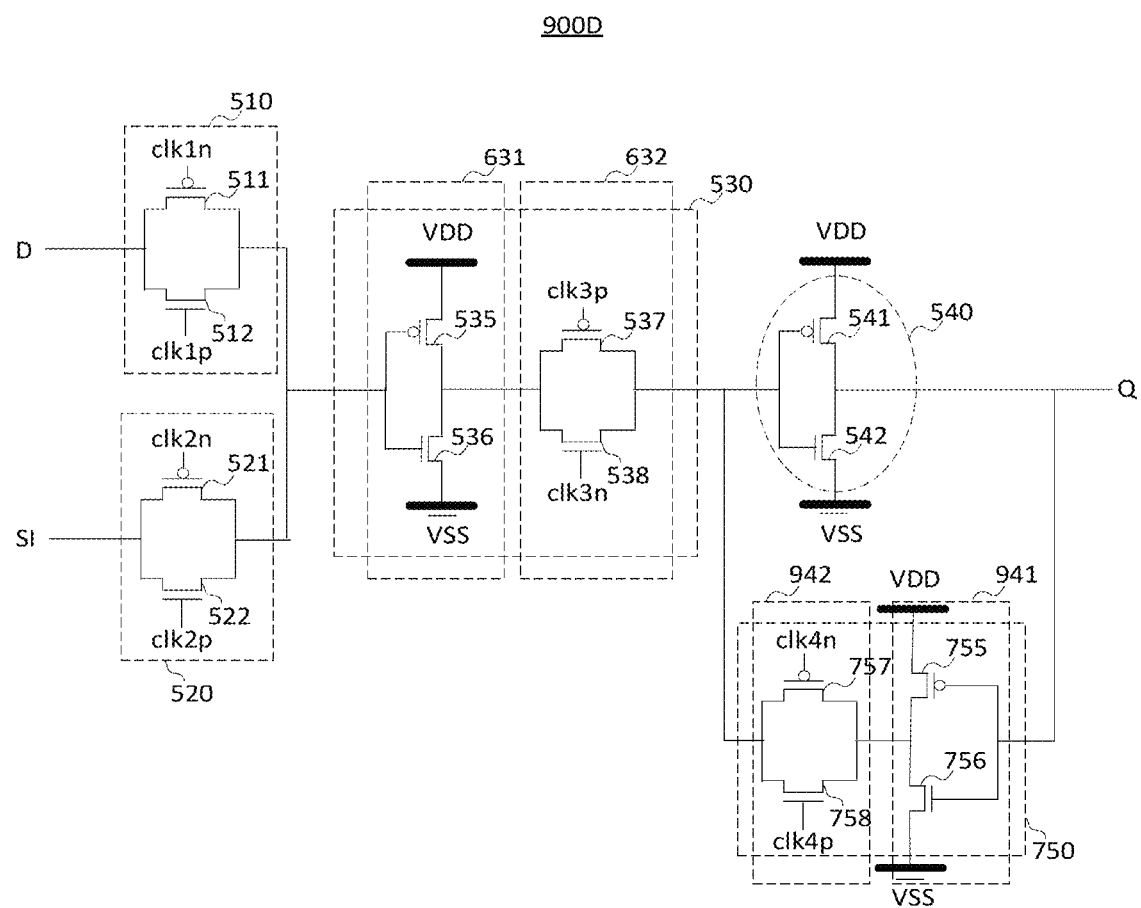

In FIG. 9B and FIG. 9D, a gate of the PMOS transistor 757 is configured to receive the inverted signal clk4n of the fourth clock signal, and a gate of the NMOS transistor 758 is configured to receive the in-phase signal clk4p of the fourth clock signal. Therefore, the inverted feedback unit 750 is turned on when clk4p is at a high level and clk4n is at a low level, and is turned off when clk4p is at a low level and clk4n is at a high level.

In some embodiments of the present disclosure, the in-phase signal of the fourth clock signal may be the common clock signal, and the inverted signal of the fourth clock signal may be obtained by performing a NOT operation on the common clock signal. In some embodiments of the present disclosure, the fourth clock signal may be the same as the third clock signal.

Figure 10A:
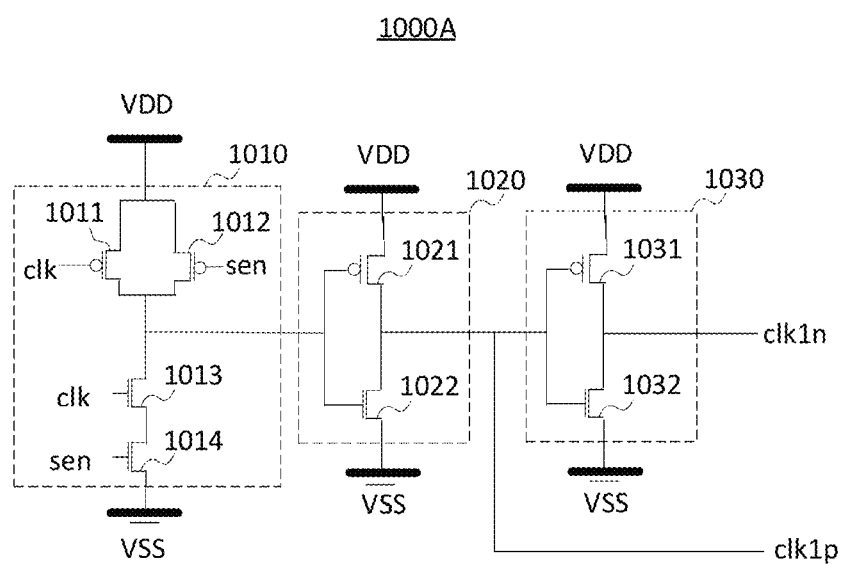
FIG. 10A and FIG. 10B illustrate clock signal generators 1000A and 1000B for generating a first clock signal according to embodiments of the present disclosure.

FIG. 10A illustrates a clock signal generator 1000A for generating a first clock signal according to embodiments of the present disclosure. The clock signal generator 1000A includes a NAND gate 1010, a NOT gate 1020, and a NOT gate 1030 connected in series. The NAND gate 1010 includes PMOS transistors 1011 and 1012 and NMOS transistors 1013 and 1014. The NOT gate 1020 includes a PMOS transistor 1021 and an NMOS transistor 1022. The NOT gate 1030 includes a PMOS transistor 1031 and an NMOS transistor 1032. The NAND gate 1010 is configured to receive a common clock signal clk and an inverted selection signal sen and provide an output to the NOT gate 1020. The NOT gate 1020 is configured to output an in-phase signal clk1p of the first clock signal and provide clk1p to the NOT gate 1030. The NOT gate 1030 is configured to output an inverted signal clk1n of the first clock signal. Therefore, the in-phase signal clk1p of the first clock signal=clk & sen.

FIG. 10A merely illustrates an example of a clock signal generator for generating the first clock signal. In some embodiments of the present disclosure, the output of the NAND gate 1010 may also provide an inverted signal clk1n of the first clock signal. However, the number of loads to which each NOT gate can be connected is limited. Therefore, a capability of the clock signal generator 1000A driving loads may be enhanced by connecting more NOT gates after the NAND gate 1010. In some embodiments of the present disclosure, two or more NOT gates may be connected after the NAND gate 1010 to form a clock tree. The output of the NAND gate 1010 serves as a root node of the clock tree. These NOT gates may be connected to form an H-tree, fishbone, or mesh structure.

Figure 10B:
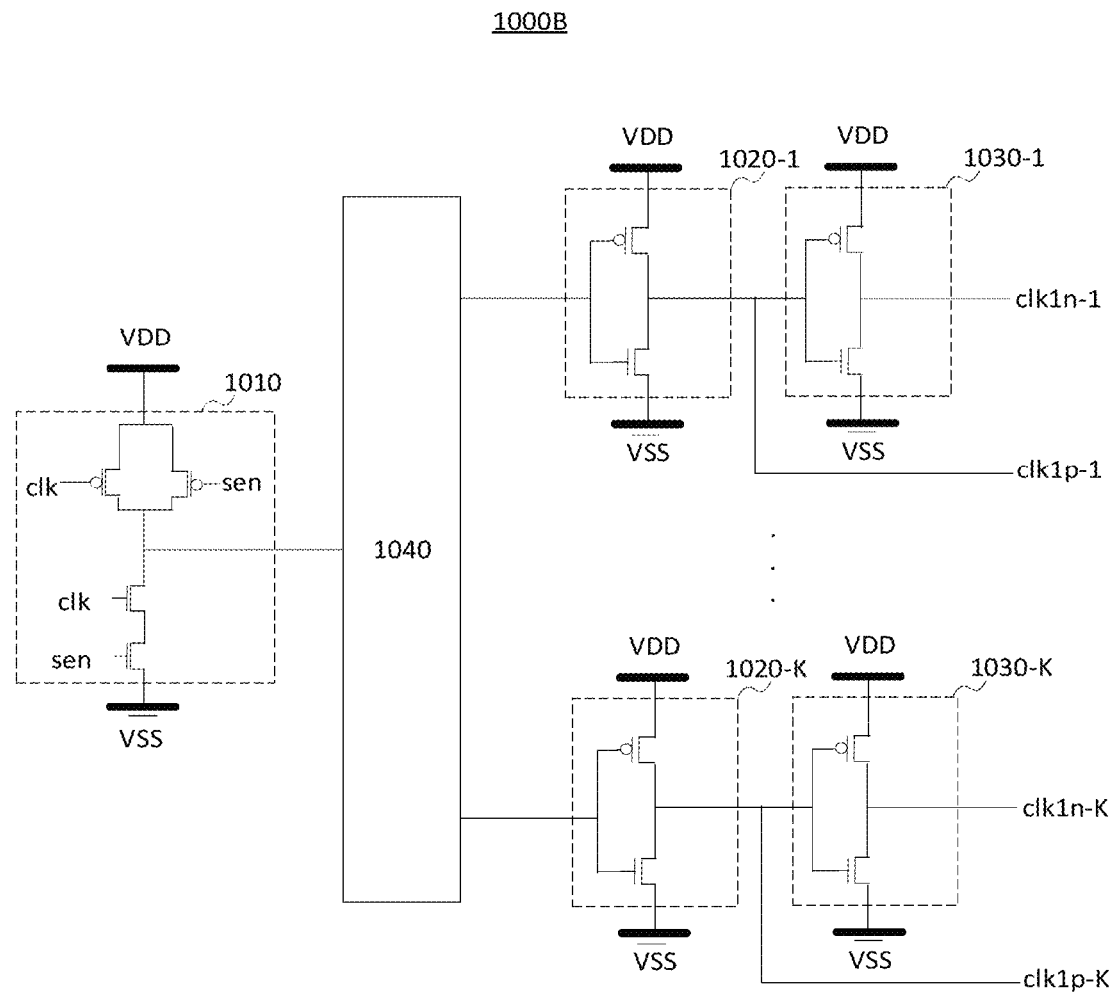

FIG. 10B illustrates a clock signal generator 1000B for generating a first clock signal according to embodiments of the present disclosure. Compared with the clock signal generator 1000A, the clock signal generator 1000B further includes a clock tree 1040 comprising two or more NOT gates. In addition, the clock signal generator 1000B further includes K pairs of NOT gates connected in series, namely, (1020-1, 1030-1), . . . , (1020-K, 1030-K). These K pairs of NOT gates connected in series may output K pairs of signals having opposite phases, namely, (clk1p-1, clk1n-1), . . . , (clk1p-K, clk1n-K). Each pair of signals outputted by each pair of NOT gates may be used as a first clock signal. Each pair of signals may be provided to a plurality of loads (for example, the D flip-flop of the present disclosure). Therefore, the clock signal generator 1000B may drive more loads than the clock signal generator 1000A.

Figure 11A:
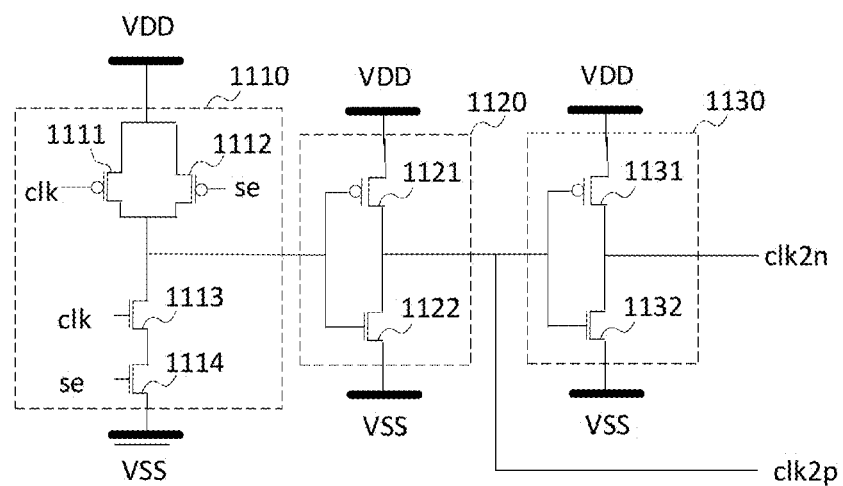
FIG. 11A and FIG. 11B illustrate clock signal generators 1100A and 1100B for generating a second clock signal according to embodiments of the present disclosure.

FIG. 11A illustrates a clock signal generator 1100A for generating a second clock signal according to embodiments of the present disclosure. The clock signal generator 1100A includes a NAND gate 1110, a NOT gate 1120, and a NOT gate 1130 connected in series. The NAND gate 1110 includes PMOS transistors 1111 and 1112 and NMOS transistors 1113 and 1114. The NOT gate 1120 includes a PMOS transistor 1121 and an NMOS transistor 1122. The NOT gate 1130 includes a PMOS transistor 1131 and an NMOS transistor 1132. The NAND gate 1110 is configured to receive a common clock signal clk and a selection signal se and provide an output to the NOT gate 1120. The NOT gate 1120 is configured to output an in-phase signal clk2p of the second clock signal and provide clk2p to the NOT gate 1130. The NOT gate 1130 is configured to output an inverted signal clk2n of the second clock signal. Therefore, the in-phase signal clk2p of the second clock signal=clk & se.

FIG. 11A merely illustrates an example of a clock signal generator for generating the second clock signal. In some embodiments of the present disclosure, the output of the NAND gate 1110 may also provide an inverted signal clk2n of the second clock signal. However, the number of loads to which each NOT gate can be connected is limited. Therefore, a capability of the clock signal generator 1100A driving loads may be enhanced by connecting more NOT gates after the NAND gate 1110. In some embodiments of the present disclosure, two or more NOT gates may be connected after the NAND gate 1110 to form a clock tree. The output of the NAND gate 1110 serves as a root node of the clock tree. These NOT gates may be connected to form an H-tree, fishbone, or mesh structure.

Figure 11B:
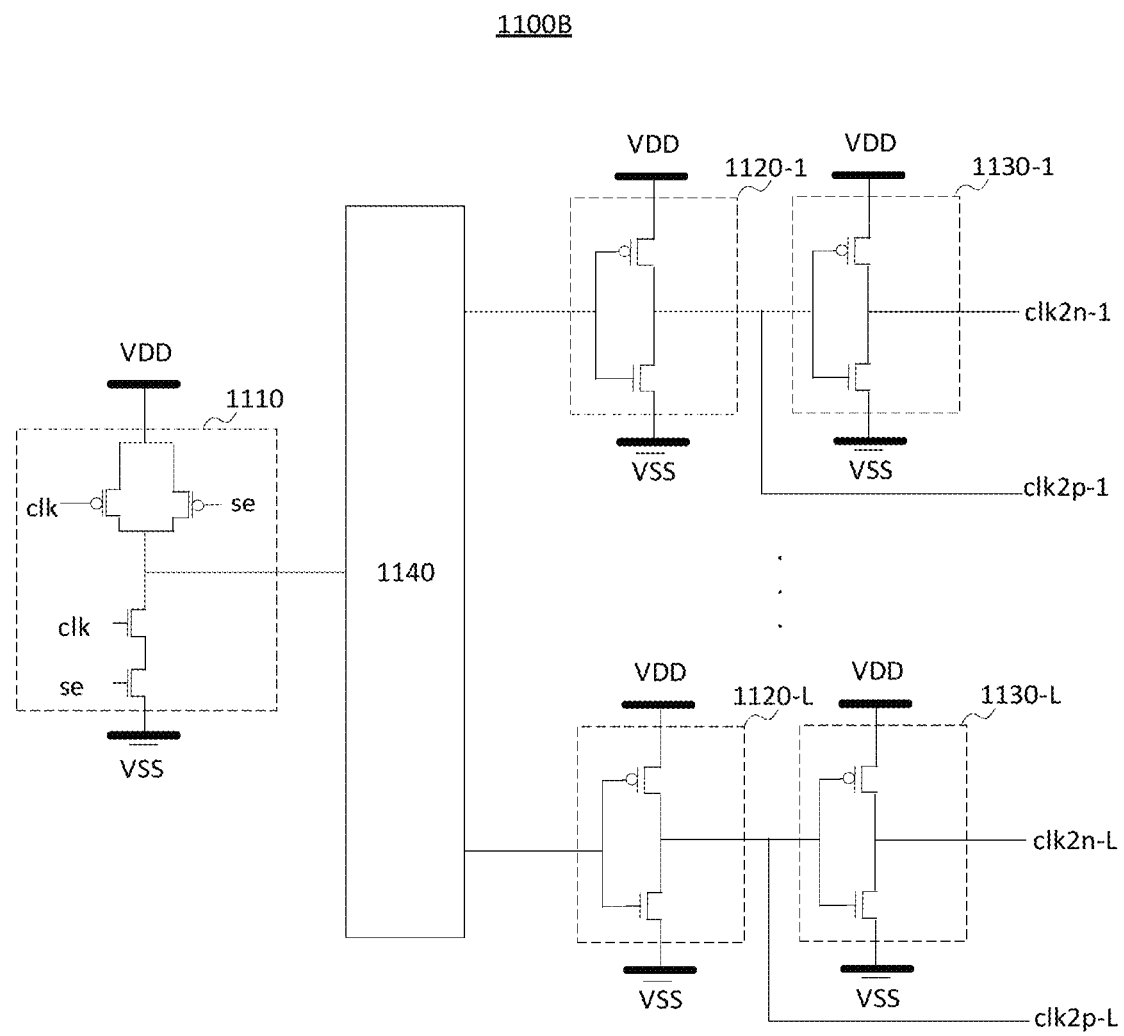

FIG. 11B illustrates a clock signal generator 1100B for generating a second clock signal according to embodiments of the present disclosure. Compared with the clock signal generator 1100A, the clock signal generator 1100B further includes a clock tree 1140 comprising two or more NOT gates. In addition, the clock signal generator 1100B further includes L pairs of NOT gates connected in series, namely, (1120-1, 1130-1), . . . , (1120-L, 1130-L). These L pairs of NOT gates connected in series may output L pairs of signals having opposite phases, namely, (clk2p–1, clk2n–1), . . . , (clk2p–L, clk2n–L). Each pair of signals outputted by each pair of NOT gates may be used as a second clock signal. Each pair of signals may be provided to a plurality of loads (for example, the D flip-flop of the present disclosure). Therefore, the clock signal generator 1100B may drive more loads than the clock signal generator 1100A. The selection signal se is configured to select whether the first data signal D or the second data signal SI is transmitted to the input end of the inverted latch unit 530. The inverted selection signal sen is an inverted signal of the selection signal se. The inverted selection signal sen may be obtained by applying the selection signal se to an inverter.

Figure 12A:
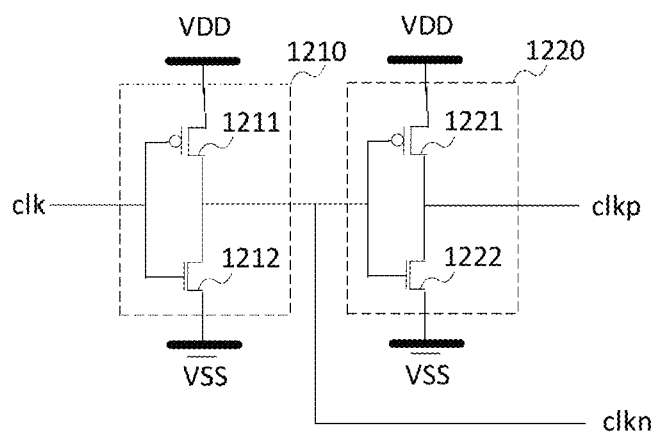
FIG. 12A and FIG. 12B illustrate clock signal generators 1200A and 1200B for generating a third clock signal/fourth clock signal according to embodiments of the present disclosure.

FIG. 12A illustrates a clock signal generator 1200A for generating a third clock signal/fourth clock signal according to embodiments of the present disclosure. The clock signal generator 1200A includes a NOT gate 1210 and a NOT gate 1220 connected in series. The NOT gate 1210 includes a PMOS transistor 1211 and an NMOS transistor 1212. The NOT gate 1220 includes a PMOS transistor 1221 and an NMOS transistor 1222. The NOT gate 1210 is configured to receive a common clock signal clk, output clkn, and provide clkn to the NOT gate 1220. The NOT gate 1220 is configured to output clkp. clkp and clkn may be used as the in-phase signal and the inverted signal of the third clock signal, or as the in-phase signal and the inverted signal of the fourth clock signal. However, the number of loads to which each NOT gate can be connected is limited. Therefore, a capability of the clock signal generator 1200A driving loads may be enhanced by connecting more NOT gates.

Figure 12B:
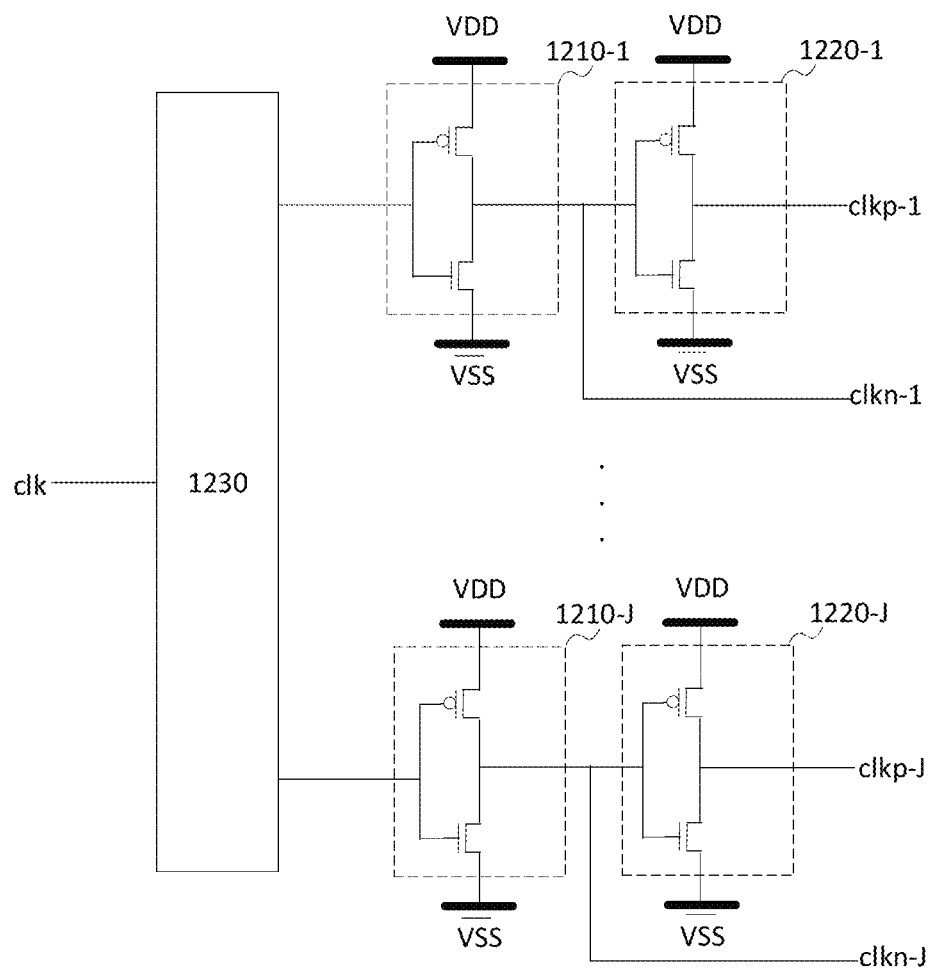

FIG. 12B illustrates a clock signal generator 1200B for generating a third clock signal/fourth clock signal according to embodiments of the present disclosure. Compared with the clock signal generator 1200A, the clock signal generator 1200B further includes a clock tree 1230 comprising two or more NOT gates. The clock tree 1230 may be an H-tree, fishbone, or mesh structure. In addition, the clock signal generator 1200B further includes J pairs of NOT gates connected in series, namely, (1210-1, 1220-1), . . . , (1210-J, 1220-J). These J pairs of NOT gates connected in series may output J pairs of signals having opposite phases, namely, (clkp–1, clkn–1), . . . , (clkp–J, clkn–J). Each pair of signals outputted by each pair of NOT gates may be used as a third clock signal/fourth clock signal. Each pair of signals may be provided to a plurality of loads (for example, the D flip-flop of the present disclosure). Therefore, the clock signal generator 1200B may drive more loads than the clock signal generator 1200A.

Figure 13:
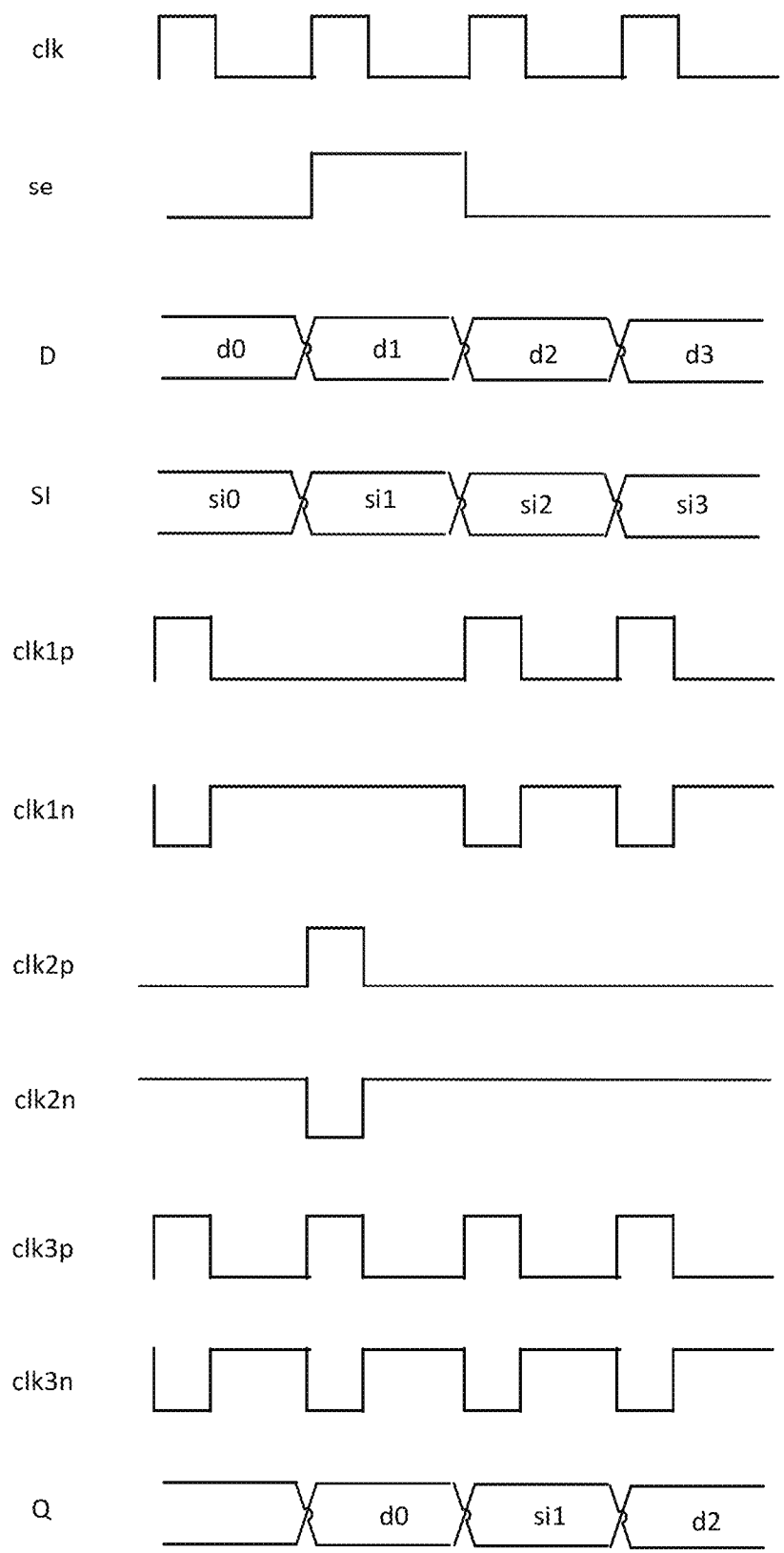
FIG. 13 illustrates a signal timing diagram when the first clock signal, the second clock signal, and the third clock signal according to embodiments of the present disclosure are applied to the CMOS circuit in FIG. 6A.

FIG. 13 illustrates a signal timing diagram when the first clock signal, the second clock signal, and the third clock signal according to embodiments of the present disclosure are applied to the CMOS circuit in FIG. 6A. The transmission gate 510 latches the first data signal D when clk1p is at a high level and clk1n is at a low level and outputs the first data signal D when clk1p is at a low level and clk1n is at a high level. The transmission gate 520 latches the second data signal SI when clk2p is at a high level and clk2n is at a low level and outputs the second data signal SI when clk2p is at a low level and clk2n is at a high level. Therefore, both the transmission gate 510 and the transmission gate 520 serve as a latch unit. In addition, because the se signal is incorporated into the first clock signal and the second clock signal, the first clock signal and the second clock signal can be used both as clock signals to latch data and as selection signals to select whether to output the first data signal D from the transmission gate 510 or to output the second data signal SI from the transmission gate 520. In addition, because only one of the in-phase signal clk1p of the first clock signal and the in-phase signal clk2p of the second clock signal is at a low level at any time, only one of the first data signal D and the second data signal SI is provided to the data input end of the inverted latch unit 530 by the transmission gate 510 and the transmission gate 520 at any time. Therefore, the D flip-flop 500 outputs only one of the first data signal D and the second data signal SI at any time.

Figure 14:
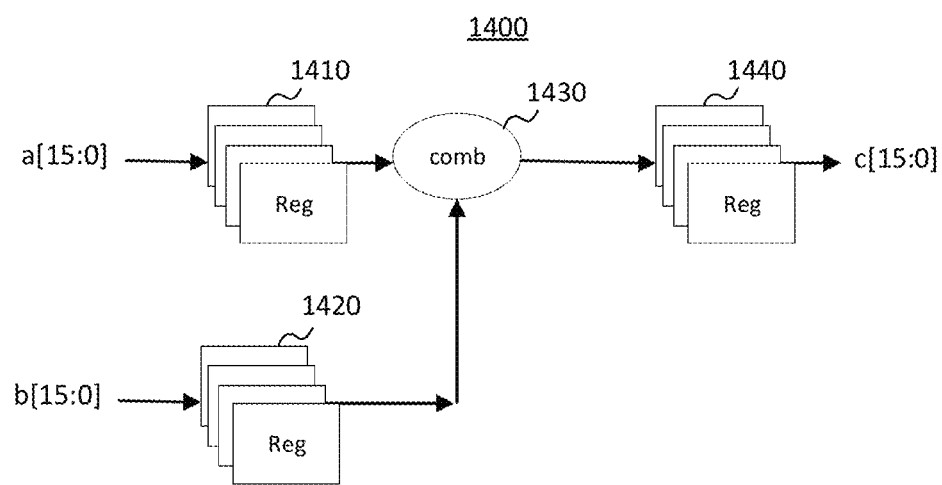
FIG. 14 illustrates an arithmetic circuit 1400 to which a D flip-flop according to embodiments of the present disclosure can be applied.

FIG. 14 illustrates an arithmetic circuit 1400 to which a D flip-flop according to embodiments of the present disclosure can be applied. The arithmetic circuit 1400 includes a register group 1410 that stores input data a[15:0], a register group 1420 that stores input data b[15:0], a combiner 1430), and a register group 1440 that stores output data c[15:0]. Each of the register groups 1410, 1420, and 1440 may include a plurality of D flip-flops according to the embodiments of the present disclosure.

Figure 15:
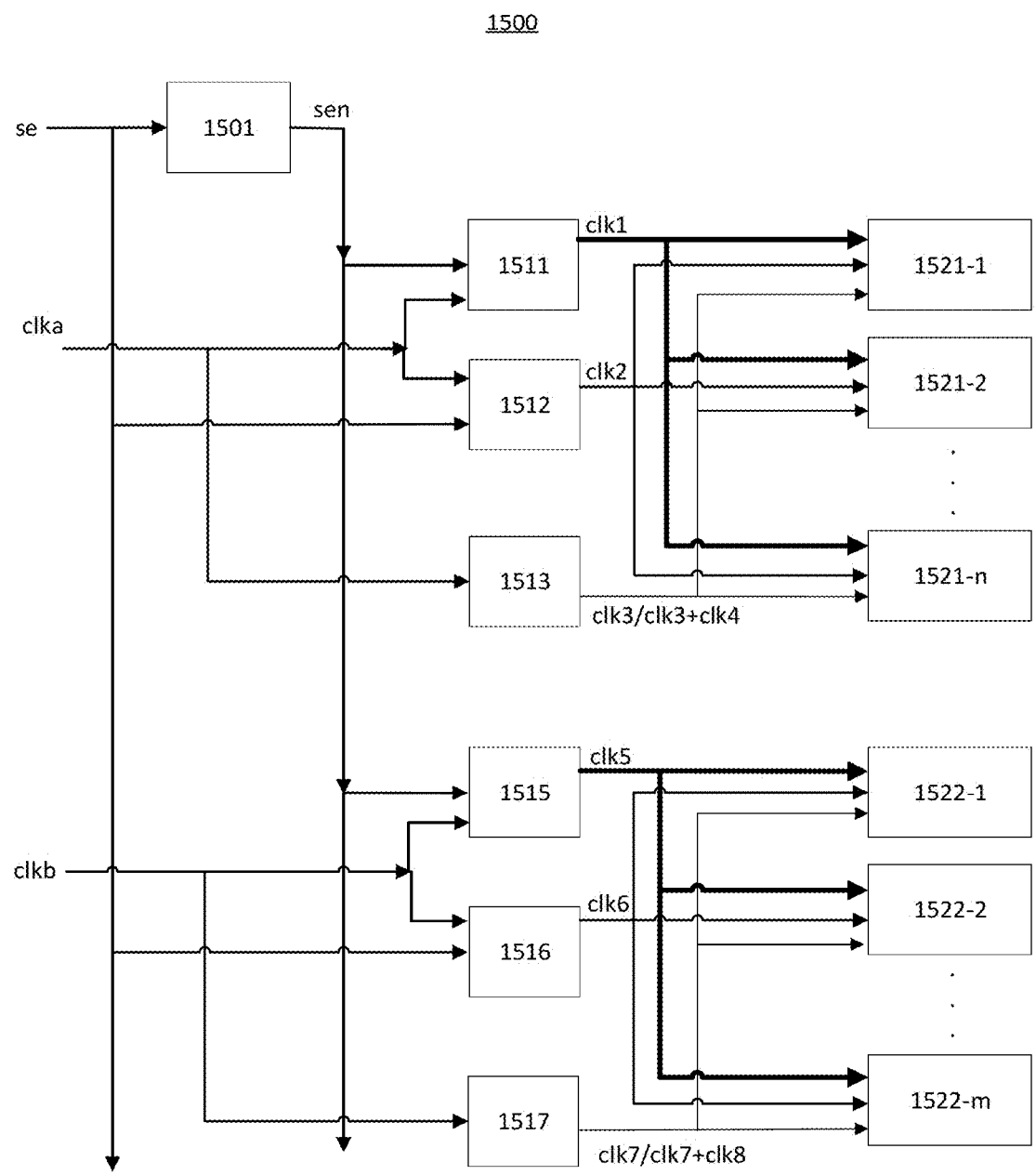
FIG. 15 illustrates an arithmetic circuit 1500 to which a D flip-flop according to embodiments of the present disclosure can be applied.

FIG. 15 illustrates an arithmetic circuit 1500 to which a D flip-flop according to embodiments of the present disclosure can be applied. The arithmetic circuit 1500 includes an inverter 1501 configured to receive a selection signal se and output an inverted selection signal sen. The arithmetic circuit 1500 further includes clock signal generators 1511, 1512, and 1513. The clock signal generator 1511 may be the clock signal generator 1000A in FIG. 10A or the clock signal generator 1000B in FIG. 10B. The clock signal generator 1511 is configured to receive the inverted selection signal sen and a common clock signal clka and output a first clock signal clk1. The clock signal generator 1512 may be the clock signal generator 1100A in FIG. 11A or the clock signal generator 1100B in FIG. 11B. The clock signal generator 1512 is configured to receive the selection signal se and the common clock signal clka and output a second clock signal clk2. The clock signal generator 1513 may be the clock signal generator 1200A in FIG. 12A or the clock signal generator 1200B in FIG. 12B. The clock signal generator 1513 is configured to receive the common clock signal clka and output a third clock signal clk3/a third clock signal and a fourth clock signal clk3+clk4. The arithmetic circuit 1500 further includes a plurality of D flip-flops 1521-1, 1521-2, . . . , 1521-n. Because the inverter 1501 and the clock signal generator 1511, 1512, and 1513 are shared by the plurality of D flip-flops 1521-1, 1521-2, . . . , 1521-n, a cost increase brought by the inverter 1501 and the clock signal generators 1511, 1512, and 1513 can be neglected.

In some embodiments of the present disclosure, the arithmetic circuit 1500 may further include clock signal generators 1515, 1516, and 1517, and a plurality of D flip-flops 1522-1, 1522-2, . . . , 1522-m. The clock signal generator 1515 may be the clock signal generator 1000A in FIG. 10A or the clock signal generator 1000B in FIG. 10B. The clock signal generator 1515 is configured to receive the inverted selection signal sen and a common clock signal clkb and output a fifth clock signal clk5. The clock signal generator 1516 may be the clock signal generator 1100A in FIG. 11A or the clock signal generator 1100B in FIG. 11B. The clock signal generator 1516 is configured to receive the selection signal se and the common clock signal clkb and output a sixth clock signal clk6. The clock signal generator 1517 may be the clock signal generator 1200A in FIG. 12A or the clock signal generator 1200B in FIG. 12B. The clock signal generator 1517 is configured to receive the common clock signal clkb and output a seventh clock signal clk7/a seventh clock signal and an eighth clock signal clk7+clk8. clk5, clk6, clk7/clk7+clk8 may be provided to the plurality of D flip-flops 1522-1, 1522-2, . . . , 1522-$m$.

In practical applications, the plurality of D flip-flops 1521-1, 1521-2, . . . , 1521-$n$ may be included on a first processing chip, and the plurality of D flip-flops 1522-1, 1522-2, . . . , 1522-$m$ may be included on a second processing chip. The processing chip may be a processing chip such as a CPU and a GPU.

Some embodiments of the present disclosure may be implemented as a D flip-flop having a multiplexer function, comprising: a first transmission gate, a data input end of the first transmission gate being configured to receive a first data signal, a clock input end of the first transmission gate being configured to receive a first clock signal; a second transmission gate, a data input end of the second transmission gate being configured to receive a second data signal, a clock input end of the second transmission gate being configured to receive a second clock signal; an inverted latch unit, a data input end of the inverted latch unit being connected to an output end of the first transmission gate and an output end of the second transmission gate, a clock input end of the inverted latch unit being configured to receive a third clock signal; and an inverter, an input end of the inverter being connected to an output end of the inverted latch unit, an output end of the inverter providing an output of the D flip-flop, wherein the first clock signal and the second clock signal cause the first transmission gate and the second transmission gate to be turned on at different times, the third clock signal causes the inverted latch unit to be turned off when one of the first transmission gate and the second transmission gate is turned on and to be turned on when both the first transmission gate and the second transmission gate are turned off.

In some embodiments of the present disclosure, the inverted latch unit is one of: a first tri-state gate; a second inverter and a third transmission gate connected in series.

In some embodiments of the present disclosure, each of the first clock signal, the second clock signal, and the third clock signal comprises an in-phase signal and an inverted signal having opposite phases.

In some embodiments of the present disclosure, the in-phase signal of the first clock signal is obtained by performing an AND operation on a common clock signal and one of a selection signal and an inverted selection signal, the inverted signal of the first clock signal is obtained by performing a NOT operation on the in-phase signal of the first clock signal, the in-phase signal of the second clock signal is obtained by performing an AND operation on the common clock signal and the other one of the selection signal and the inverted selection signal, the inverted signal of the second clock signal is obtained by performing a NOT operation on the in-phase signal of the second clock signal, the in-phase signal of the third clock signal is the common clock signal, the inverted signal of the third clock signal is obtained by performing a NOT operation on the common clock signal.

In some embodiments of the present disclosure, the D flip-flop further comprises an inverted feedback unit, a data input end of the inverted feedback unit being connected to the output end of the inverter, an output end of the inverted feedback unit being connected to the input end of the inverter, a clock input end of the inverted feedback unit being configured to receive a fourth clock signal, wherein the fourth clock signal causes the inverted feedback unit to be turned off when the inverted latch unit is turned on and to be turned on when the inverted latch unit is turned off.

In some embodiments of the present disclosure, the inverted feedback unit is one of: a second tri-state gate; a third inverter and a fourth transmission gate connected in series.

In some embodiments of the present disclosure, the fourth clock signal comprises an in-phase signal and an inverted signal having opposite phases.

In some embodiments of the present disclosure, the in-phase signal of the fourth clock signal is a common clock signal, the inverted signal of the fourth clock signal is obtained by performing a NOT operation on the common clock signal.

In some embodiments of the present disclosure, one of the first data signal and the second data signal is a functional data signal, the other one of the first data signal and the second data signal is a scan data signal.

Some embodiments of the present disclosure may be implemented as an arithmetic circuit comprising a plurality of D flip-flops of the present disclosure.

In some embodiments of the present disclosure, the arithmetic circuit further comprises: a fourth inverter, an input end of the fourth inverter being configured to receive a selection signal and output an inverted selection signal; a first clock signal generator configured to receive a common clock signal and one of the selection signal and the inverted selection signal outputted by the fourth inverter and output a first clock signal; a second clock signal generator configured to receive the common clock signal and the other one of the selection signal and the inverted selection signal outputted by the fourth inverter and output a second clock signal; and a third clock signal generator configured to receive the common clock signal and output a third clock signal.

In some embodiments of the present disclosure, the third clock signal generator is further configured to output a fourth clock signal.

Some embodiments of the present disclosure may be implemented as a computing apparatus comprising: a memory; and a processor comprising an arithmetic circuit of the present disclosure.

The D flip-flop of the present disclosure is described above in combination with specific embodiments. However, it should be understood that any feature of any embodiment may be combined with and/or substituted for any other feature of any other embodiment.

Aspects of the present disclosure may be implemented in various electronic devices. Examples of the electronic devices may include, but are not limited to, consumer electronic products, components of consumer electronic products, electronic test devices, cellular communication infrastructure such as base stations, and the like. The examples of the electronic devices may include, but are not limited to, mobile phones such as smartphones, wearable computing devices such as smart watches or headphones, phones, televisions, computer monitors, computers, modems, hand-held computers, laptop computers, tablet computers, personal digital assistants (PDAs), microwave ovens, refrigerators, in-vehicle electronic systems such as automobile electronic systems, stereo systems, DVD players, CD players, digital music players such as MP3 players, radios, camcorders, cameras such as digital cameras, portable memory chips, washing machines, dryers, washing machines/dryers, peripheral devices, clocks, and the like. Further, the electronic devices may include a non-complete product.

The terms "comprise", "include", "contain", "have", and the like, unless otherwise expressly specified in the context, should be interpreted in terms of inclusive meaning, not exclusive or exhaustive meaning throughout the specification and claims. In other words, the terms indicate "including but not limited to". As generally used herein, the term "coupled" means that two or more elements may be directly connected or connected through one or more intermediate elements. Similarly, as generally used herein, the term "connected" means that two or more elements may be directly connected or connected through one or more intermediate elements. In addition, when used in this application, the terms "herein", "hereabove", "in the following", "below", "above" and terms of similar meanings should refer to the entire text of this application, but not to any specific part of this application.

Moreover, conditional language used herein, such as "can", "may", "for example", and "such as", unless otherwise expressly specified or otherwise understood in the context of the use, is generally intended to convey that some embodiments include, while other embodiments do not include, some features, elements, and/or states. Therefore, such the conditional language is not generally intended to imply that one or more embodiments require the features, elements, and/or states in any way, or whether these features, elements, and/or states are included or performed in any particular embodiment.

Although some embodiments have been described, these embodiments have been presented by way of example only and are not intended to limit the scope of the present disclosure. Indeed, the novel device, method, and system described herein may be embodied in a variety of other forms. In addition, various omissions, substitutions, and changes may be made to the forms of the method and system described herein without departing from the spirit of the present disclosure. For example, although blocks are presented in a given arrangement, alternative embodiments may perform similar functions with different components and/or circuit topologies, and some blocks may be deleted, moved, added, subdivided, combined, and/or modified. Each of these blocks can be implemented in a variety of different ways. Any suitable combination of the elements and actions of the embodiments described above may be combined to provide further embodiments. The features and processes described above can be implemented independent of each other, or can be combined in various ways. All suitable combinations and sub-combinations of features of the present disclosure are intended to fall within the scope of the present disclosure.

The invention claimed is:

1. A D flip-flop with a non-inverted output, the D flip-flop having a multiplexer function, the D flip-flop comprising:
a first transmission gate, a data input end of the first transmission gate being configured to receive a first data signal from external to the D flip-flop, a clock input end of the first transmission gate being configured to receive a first clock signal;
a second transmission gate, a data input end of the second transmission gate being configured to receive a second data signal from external to the D flip-flop, a clock input end of the second transmission gate being configured to receive a second clock signal;
an inverted latch unit, the inverted latch unit having only one data input end that is directly connected to both an output end of the first transmission gate and an output end of the second transmission gate and configured to receive the first data signal from the output end of the first transmission gate or the second data signal from the output end of the second transmission gate, a clock input end of the inverted latch unit being configured to receive a third clock signal, the inverted latch unit having only one output end that is configured to output an inverted first data signal or an inverted second data signal; and
a single inverter, an input end of the single inverter being directly connected to the output end of the inverted latch unit and configured to receive the inverted first data signal or the inverted second data signal from the inverted latch unit, an output end of the single inverter directly providing an output end of the D flip-flop and being configured to output the first data signal or the second data signal,
wherein the first clock signal and the second clock signal cause the first transmission gate and the second transmission gate to be turned on at different times, the third clock signal causes the inverted latch unit to be turned off when one of the first transmission gate and the second transmission gate is turned on and to be turned on when both the first transmission gate and the second transmission gate are turned off,
wherein each of the first clock signal, the second clock signal, and the third clock signal comprises signals having opposite phases,
wherein,
an in-phase signal of the first clock signal is obtained by performing an AND operation on a common clock signal and one of a selection signal and an inverted selection signal, an inverted signal of the first clock signal is obtained by performing a NOT operation on the in-phase signal of the first clock signal,
an in-phase signal of the second clock signal is obtained by performing an AND operation on the common clock signal and the other one of the selection signal and the inverted selection signal, an inverted signal of the second clock signal is obtained by performing a NOT operation on the in-phase signal of the second clock signal,
an in-phase signal of the third clock signal is the common clock signal, an inverted signal of the third clock signal is obtained by performing a NOT operation on the common clock signal.

2. The D flip-flop according to claim 1, wherein the inverted latch unit is one of:
a first tri-state gate; or
a second inverter and a third transmission gate connected in series.

3. The D flip-flop according to claim 1, further comprising an inverted feedback unit, a data input end of the inverted feedback unit being connected to the output end of the inverter, an output end of the inverted feedback unit being connected to the input end of the inverter, a clock input end of the inverted feedback unit being configured to receive a fourth clock signal, wherein the fourth clock signal causes the inverted feedback unit to be turned off when the inverted latch unit is turned on and to be turned on when the inverted latch unit is turned off.

4. The D flip-flop according to claim 3, wherein the inverted feedback unit is one of:
a second tri-state gate; or
a third inverter and a fourth transmission gate connected in series.

5. The D flip-flop according to claim 3, wherein, the fourth clock signal comprises signals having opposite phases.

6. The D flip-flop according to claim 5, wherein an in-phase signal of the fourth clock signal is the common clock signal, an inverted signal of the fourth clock signal is obtained by performing a NOT operation on the common clock signal.

7. An arithmetic circuit comprising a plurality of D flip-flops according to claim 3.

8. The arithmetic circuit according to claim 7, further comprising:
a fourth inverter, an input of the fourth inverter being configured to receive the selection signal and output the inverted selection signal;
a first clock signal generator configured to receive the common clock signal and the one of the selection signal and the inverted selection signal outputted by the fourth inverter and output the first clock signal;
a second clock signal generator configured to receive the common clock signal and the other one of the selection signal and the inverted selection signal outputted by the fourth inverter and output the second clock signal; and
a third clock signal generator configured to receive the common clock signal and output the third clock signal and the fourth clock signal.

9. The D flip-flop according to claim 1, wherein one of the first data signal and the second data signal is a functional data signal, the other one of the first data signal and the second data signal is a scan data signal.

10. An arithmetic circuit comprising a plurality of D flip-flops according to claim 1.

11. The arithmetic circuit according to claim 10, further comprising:
a fourth inverter, an input of the fourth inverter being configured to receive the selection signal and output the inverted selection signal;
a first clock signal generator configured to receive the common clock signal and the one of the selection signal and the inverted selection signal outputted by the fourth inverter and output the first clock signal;
a second clock signal generator configured to receive the common clock signal and the other one of the selection signal and the inverted selection signal outputted by the fourth inverter and output the second clock signal; and
a third clock signal generator configured to receive the common clock signal and output the third clock signal.

12. A processor comprising an arithmetic circuit that comprises a plurality of D flip-flops according to claim 1.

* * * * *